US011955409B2

(12) United States Patent
Patil et al.

(10) Patent No.: US 11,955,409 B2
(45) Date of Patent: Apr. 9, 2024

(54) SUBSTRATE COMPRISING INTERCONNECTS IN A CORE LAYER CONFIGURED FOR SKEW MATCHING

(71) Applicant: QUALCOMM Incorporated, San Diego, CA (US)

(72) Inventors: Aniket Patil, San Diego, CA (US); Joan Rey Villarba Buot, Escondido, CA (US); Hong Bok We, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 432 days.

(21) Appl. No.: 17/148,257

(22) Filed: Jan. 13, 2021

(65) Prior Publication Data

US 2022/0223499 A1 Jul. 14, 2022

(51) Int. Cl.
H01L 23/48 (2006.01)
H01L 21/768 (2006.01)
H01L 23/12 (2006.01)
H01L 23/66 (2006.01)

(52) U.S. Cl.
CPC ...... *H01L 23/481* (2013.01); *H01L 21/76898* (2013.01); *H01L 23/12* (2013.01); *H01L 23/66* (2013.01); *H01L 2223/6622* (2013.01); *H01L 2223/6638* (2013.01)

(58) Field of Classification Search
CPC ....... H01L 2223/6638; H01L 23/12–15; H01L 23/498–49894; H01L 23/538–5389; H01L 23/66; H01L 23/481; H01L 21/76898; H01L 2223/6622
See application file for complete search history.

(56) References Cited

U.S. PATENT DOCUMENTS 7,180,011 B1 * 2/2007 Hall ..................... H05K 1/0245
257/776
2008/0083560 A1 4/2008 Saiki et al.
2013/0098670 A1 4/2013 Inoue et al.

FOREIGN PATENT DOCUMENTS

JP 2012009510 A 1/2012

OTHER PUBLICATIONS

International Search Report and Written Opinion—PCT/US2021/062859—ISA/EPO—dated Apr. 7, 2022.

* cited by examiner

*Primary Examiner* — Tucker J Wright
(74) *Attorney, Agent, or Firm* — Loza & Loza, LLP

(57) ABSTRACT

A package comprising an integrated device and a substrate. The integrated device is coupled to the substrate. The substrate includes a core layer, at least one first dielectric layer coupled to a first surface of the core layer, and at least one second dielectric layer coupled to a second surface of the core layer. The substrate includes a match structure located in the core layer. The match structure includes at least one first match interconnect extending vertically and horizontally in the match structure. The match structure also includes at least one second match interconnect extending vertically in the match structure. The at least one first match interconnect and the at least one second match interconnect are configured for skew matching.

24 Claims, 22 Drawing Sheets

SIDE PROFILE VIEW

SIDE PROFILE VIEW

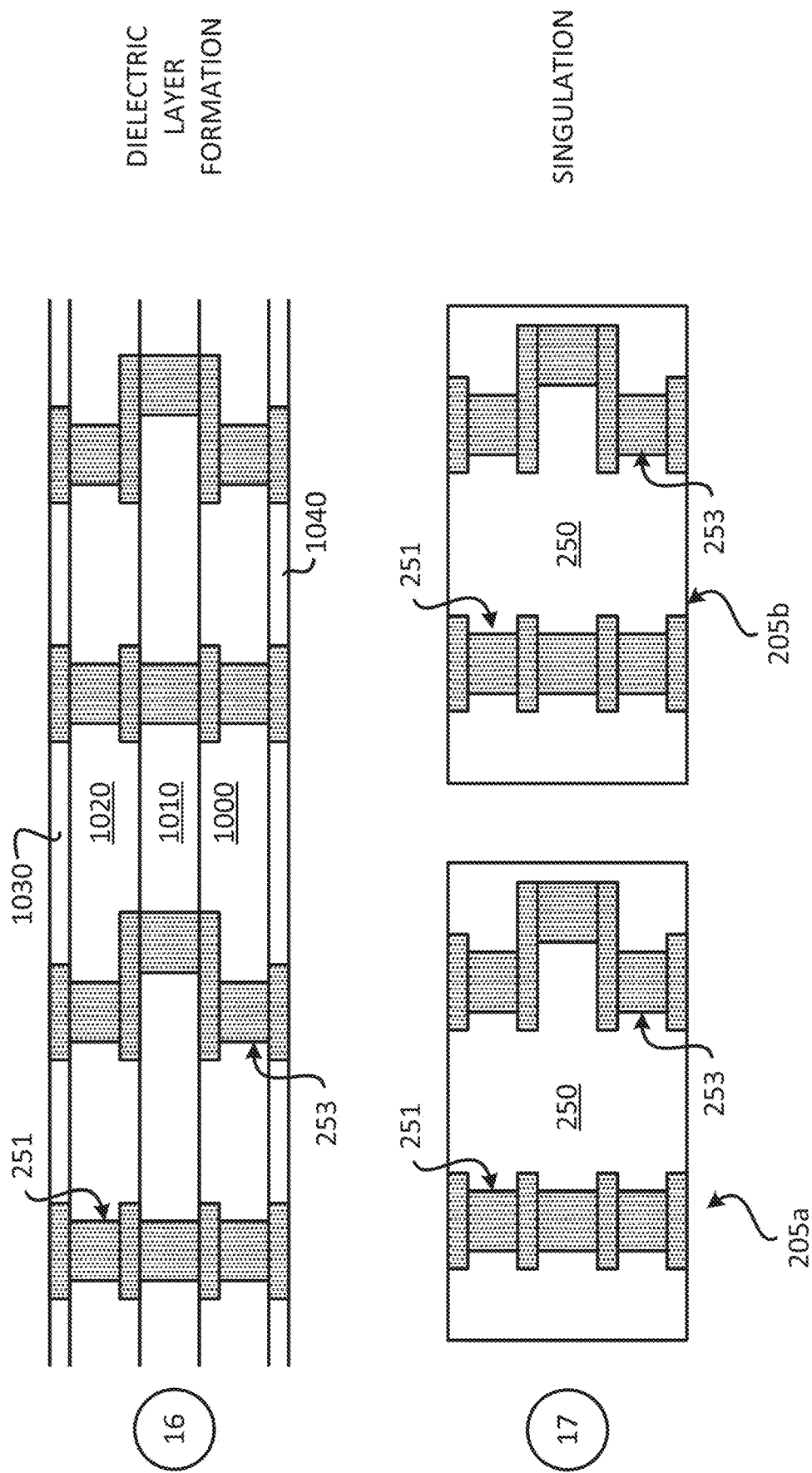

SUBSTRATE COMPRISING INTERCONNECTS IN A CORE LAYER CONFIGURED FOR SKEW MATCHING

FIELD

Various features relate to packages and substrates, but more specifically to substrates that include interconnects.

BACKGROUND

FIG. 1 illustrates a package 100 that includes a substrate 102, an integrated device 106, and an integrated device 108. The integrated device 106 is coupled to a surface of the substrate 102. The integrated device 108 is coupled to the surface of the substrate 102. The substrate 102 includes at least one dielectric layer 120 and a plurality of interconnects 122. A plurality of solder interconnects 130 is coupled to the substrate 102. Interconnects in the substrate 102 may take up a lot of space and there is an ongoing need to improve and optimize the designs of interconnects in the substrate 102.

SUMMARY

Various features relate to packages and substrates, but more specifically to substrates that include interconnects.

One example provides a substrate that includes a core layer, at least one first dielectric layer coupled to a first surface of the core layer, and at least one second dielectric layer coupled to a second surface of the core layer. The substrate includes a match structure located in the core layer. The match structure includes at least one first match interconnect extending vertically and horizontally in the core layer. The match structure also includes at least one second match interconnect extending vertically in the match structure. The at least one first match interconnect and the at least one second match interconnect are configured to provide skew matching.

Another example provides a package that includes a substrate and an integrated device coupled to the substrate. The substrate includes a core layer, at least one first dielectric layer coupled to a first surface of the core layer, and at least one second dielectric layer coupled to a second surface of the core layer. The substrate includes a match structure located in the core layer. The match structure includes at least one first match interconnect extending vertically and horizontally in the match structure. The match structure also includes at least one second match interconnect extending vertically in the match structure. The at least one first match interconnect and the at least one second match interconnect are configured to provide skew matching.

Another example provides an apparatus comprising a core layer, a means for skew matching, at least one first dielectric layer coupled to a first surface of the core layer, and at least one second dielectric layer coupled to a second surface of the core layer. The means for skew matching is located in the core layer. The means for skew matching includes at least one first match interconnect extending vertically and horizontally in the means for skew matching, and at least one second match interconnect extending vertically in the means for skew matching. The at least one first match interconnect and the at least one second match interconnect are configured to provide time signal matching for a first signal and a second signal.

Another example provides a method for fabricating a substrate. The method provides a core layer with at least one cavity. The method places a match structure in the at least one cavity of the core layer. The match structure includes at least one first match interconnect extending vertically and horizontally in the match structure, and at least one second match interconnect extending vertically in the match structure. The at least one first match interconnect and the at least one second match interconnect are configured to provide skew matching. The method forms at least one first dielectric layer over to a first surface of the core layer. The method forms at least one second dielectric layer over to a second surface of the core layer.

BRIEF DESCRIPTION OF THE DRAWINGS

Various features, nature and advantages may become apparent from the detailed description set forth below when taken in conjunction with the drawings in which like reference characters identify correspondingly throughout.

FIGS. 10A-10F illustrate an exemplary sequence for fabricating a match structure comprising a pair of interconnects configured for skew matching.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a package that includes a substrate and at least one integrated device coupled to the substrate. The substrate includes a core layer, at least one first dielectric layer coupled to a first surface of the core layer, and at least one second dielectric layer coupled to a second surface of the core layer. The substrate includes a match structure located in the core layer. The match structure includes at least one first match interconnect extending vertically and horizontally in the match structure. The match structure also includes at least one second match interconnect extending vertically in the match structure. The at least one first match interconnect and the at least one second match interconnect are configured to provide skew matching (e.g., skew matching for a pair of differential signals). The match structure may include at least one dielectric layer. The match structure may include a structure core layer and at least one dielectric layer. The at least one first match interconnect may be configured to provide an electrical path for a first signal (e.g., positive signal). The at least one second match interconnect may be configured to provide an electrical path for a second signal (e.g., negative signal). The positive signal and the negative signal may be configured as a pair of differential signals. The second signal may be an inverted signal of the first signal, and vice versa.

Exemplary Package Comprising a Match Structure in a Core Layer of a Substrate

Figure 1:
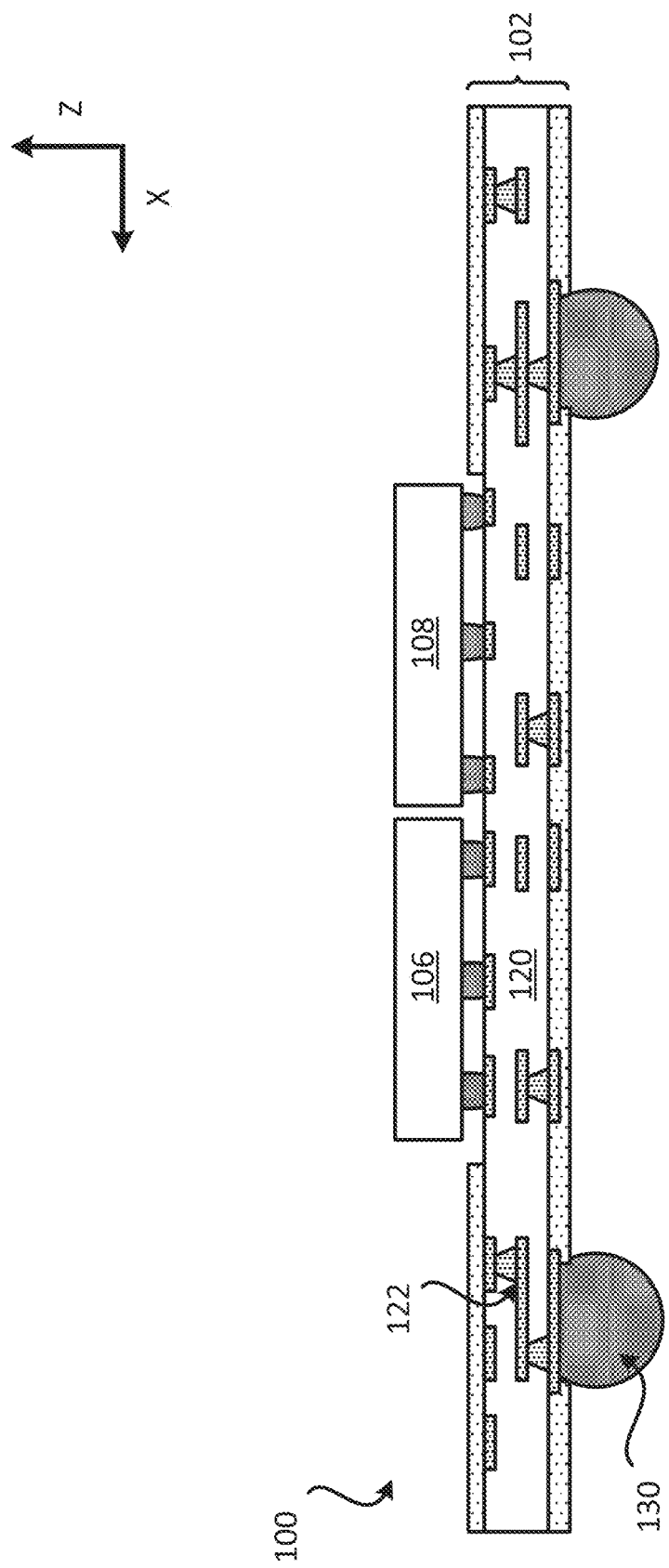
FIG. 1 illustrates a package that includes a substrate and integrated devices.
Figure 2:
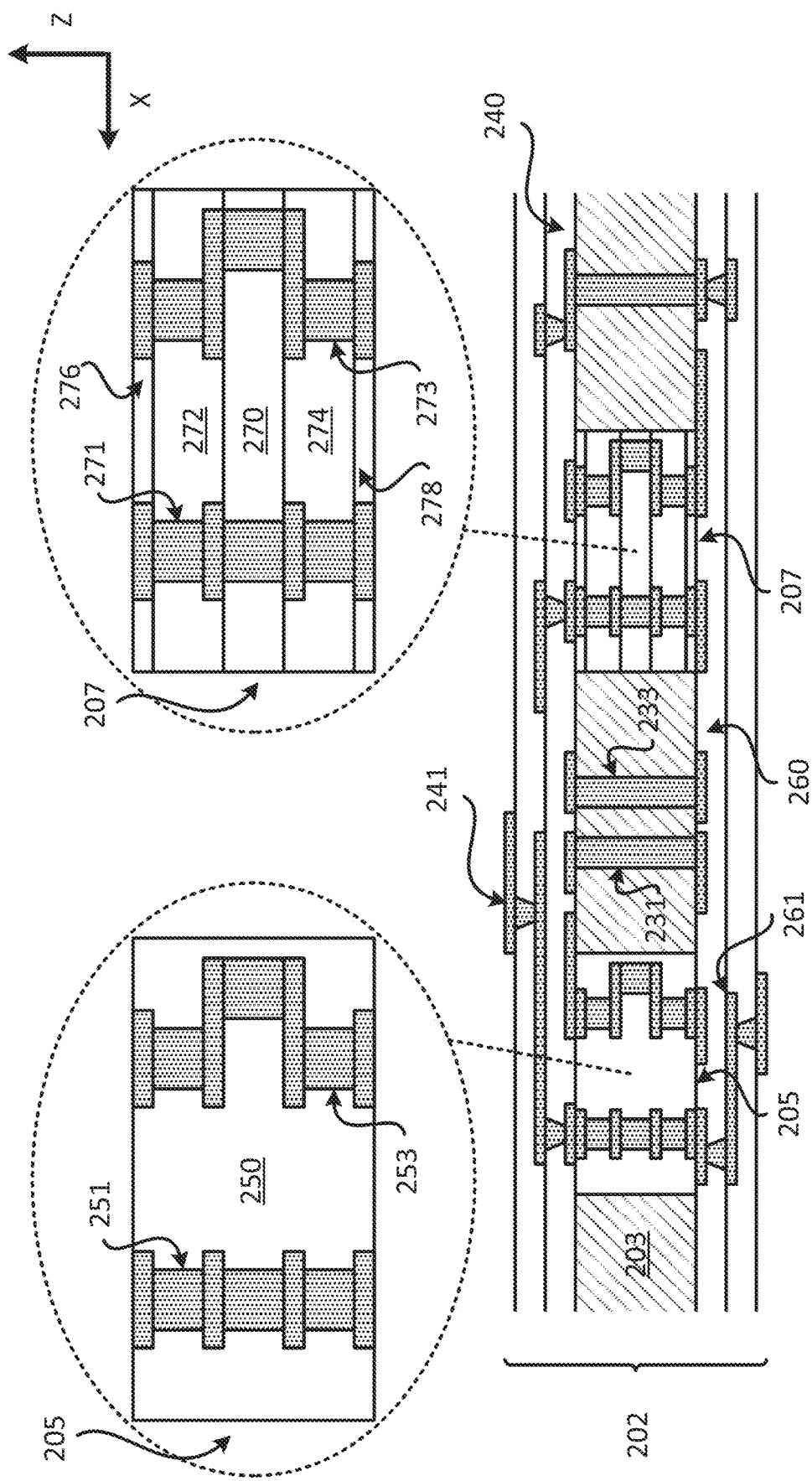
FIG. 2 illustrates a profile view of an exemplary substrate that includes interconnects in the core layer configured for skew matching.

FIG. 2 illustrates a substrate 202 that includes at least one match structure with interconnects configured to provide skew matching and/or signal time matching. The substrate 202 may be implemented in a package with at least one integrated device. The substrate 202 includes a core layer 203, at least one first dielectric layer 240, a first plurality of interconnects 241, at least one second dielectric layer 260, a second plurality of interconnects 261, a match structure 205, a match structure 207, a first core interconnect 231, and a second core interconnect 233.

The match structure 205 is located in the core layer 203. The match structure 207 is located in the core layer 203. The first core interconnect 231 and the second core interconnect 233 are located in and extend through the core layer 203. The first core interconnect 231 and the second core interconnect 233 may be part of a pair of electrical paths that are configured for a pair of differential signals. The at least one first dielectric layer 240 and the first plurality of interconnects 241 are coupled to a first surface (e.g., top surface) of the core layer 203. The at least one second dielectric layer 260 and the second plurality of interconnects 261 are coupled to a second surface (e.g., bottom surface) of the core layer 203.

The first plurality of interconnects 241 is coupled (e.g., electrically coupled) to the match structure 205, the match structure 207, the first core interconnect 231, and/or the second core interconnect 233. The second plurality of interconnects 261 is coupled (e.g., electrically coupled) to the match structure 205, the match structure 207, the first core interconnect 231, and/or the second core interconnect 233.

The match structure 205 and/or the match structure 207 may help skew matching and/or signal time matching in differential signaling. The match structure 205 and/or the match structure 207 may be a means for skew matching. The use of differential signaling (e.g., pair of differential signals) provides several advantages. For example, differential signaling are more resistant to electromagnetic interference (EMI) and/or crosstalk. Differential signaling also reduces outgoing EMI and crosstalk. Differential signaling may operate at a lower voltage than single-ended signals. However, differential signaling requires that the length that each respective signal travels through is as match each other (or as close to each other as possible). Thus, if a first signal travels distance X, then a second signal that is part of the pair of differential signals, should ideally travel distance X, or as close to the distance X as possible. For example, if an electrical path between two terminals for the first signal has an effective distance/length X, then another electrical path between two other terminals for the second signal has an effective distance/length X (or as close to X as possible) (e.g., the difference between the two effective distances/lengths is within 2% of the effective distance/length X). In a differential signaling pair, to ensure that the first signal travels the same distance as the second signal, and vice versa, at least one match structure (e.g., 205, 207) may be used. Different implementations may define terminals differently. A terminal may be part of an integrated device. An electrical path between two terminals may be an electrical path between two integrated devices. For a pair of differential signals, each respective signal may be coupled to a pair of different terminals for the same pair of integrated devices. For example, (i) a first signal between a first integrated device and a second integrated device may travel through a first electrical path configured to be coupled (e.g., electrically coupled) to a first terminal of the first integrated device and a first terminal of the second integrated device, and (ii) a second signal between the first integrated device and the second integrated device may travel through a second electrical path configured to be coupled (e.g., electrically coupled) to a second terminal of the first integrated device and a second terminal of the second integrated device, where the first signal and the second signal are part of a pair of differential signals.

The match structure 205 includes at least one dielectric layer 250 (e.g., structure dielectric layer), a first plurality of match interconnects 251, and a second plurality of match interconnects 253. The first plurality of match interconnects 251 extends (e.g., vertically extends) through the at least one dielectric layer 250 of the match structure 205. The second plurality of match interconnects 253 extends (e.g., vertically and/or horizontally extends) through the at least one dielectric layer 250 of the match structure 205.

The first plurality of match interconnects 251 and the second plurality of match interconnects 253 are a differential pair of interconnects. The first plurality of match interconnects 251 is configured to provide an electrical path for a first signal. The second plurality of match interconnects 253 is configured to provide an electrical path for a second signal. The first signal and the second signal may be high speed signals. The first signal and the second signal may be a pair of differential signals. The first signal may be a positive signal, and the second signal may be a negative signal. The second signal may be a positive signal, and the first signal may be a negative signal. The second signal may be an opposite signal to the first signal, and vice versa. The second signal may be an inverted signal of the first signal, and vice versa.

The first plurality of match interconnects 251 has a first electrical path length (e.g., first effective electrical path length). The second plurality of match interconnects 253 has a second electrical path length (e.g., second effective electrical path length). The first plurality of match interconnects 251 has a lower electrical path length, than the electrical path length of the second plurality of match interconnects 253. The first plurality of match interconnects 251 is part of a first electrical path between two first terminals (e.g., first terminal of a first integrated device and a first terminal of a second integrated device). The second plurality of match interconnects 253 is part of a second electrical path between two second terminals (e.g., second terminal of the first integrated device and a second terminal of the second integrated device). The second plurality of match interconnects 253 may have a serpentine design with various turns in the match structure 205. The match structure 205 helps ensure that the first electrical path length between two first terminals is the same or approximately the same as the second electrical path length between two second terminals. The two first terminals may be a pair of terminals between two integrated devices. The two second terminals may be a pair of terminals between the same two integrated devices. The two integrated devices may be coupled to the substrate 202, other substrates and/or a board (e.g., printed circuit board).

The match structure 207 includes a structure core layer 270, a dielectric layer 272 (e.g., structure dielectric layer), a dielectric layer 274 (e.g., structure dielectric layer), a dielectric layer 276 (e.g., structure dielectric layer), a dielectric layer 278 (e.g., structure dielectric layer), a first plurality of match interconnects 271, and a second plurality of match interconnects 273. The first plurality of match interconnects 271 extends (e.g., vertically extends) through dielectric layers of the match structure 207. The second plurality of match interconnects 273 extends (e.g., vertically and/or horizontally extends) through the dielectric layers of the match structure 207.

The first plurality of match interconnects 271 and the second plurality of match interconnects 273 are a differential pair of interconnects. The first plurality of match interconnects 271 is configured to provide an electrical path for a third signal. The second plurality of match interconnects 273 is configured to provide an electrical path for a fourth signal. The third signal and the fourth signal may be high speed signals. The third signal and the fourth signal may be a pair of differential signals. The third signal may be a positive signal, and the fourth signal may be a negative signal. The fourth signal may be a positive signal, and the third signal may be a negative signal. The fourth signal may be an opposite signal to the third signal, and vice versa. The fourth signal may be an inverted signal to the third signal, and vice versa.

The first plurality of match interconnects 271 has a third electrical path length (e.g., third effective electrical path length). The second plurality of match interconnects 273 has a fourth electrical path length (e.g., fourth effective electrical path length). The third plurality of match interconnects 271 has a lower electrical path length, than the electrical path length of the second plurality of match interconnects 273. The first plurality of match interconnects 271 is part of a third electrical path between two first terminals. The second plurality of match interconnects 273 is part of a fourth electrical path between two second terminals. The second plurality of match interconnects 273 may have a serpentine design with various turns in the match structure 207. The match structure 207 helps ensure that the third electrical path length between two first terminals is the same or approximately the same as the fourth electrical path length between two second terminals. The two first terminals may be a pair of terminals between two integrated devices. The two second terminals may be a pair of terminals between the same two integrated devices. The two integrated devices may be coupled to the substrate 202, other substrates and/or a board (e.g., printed circuit board).

Figure 3:
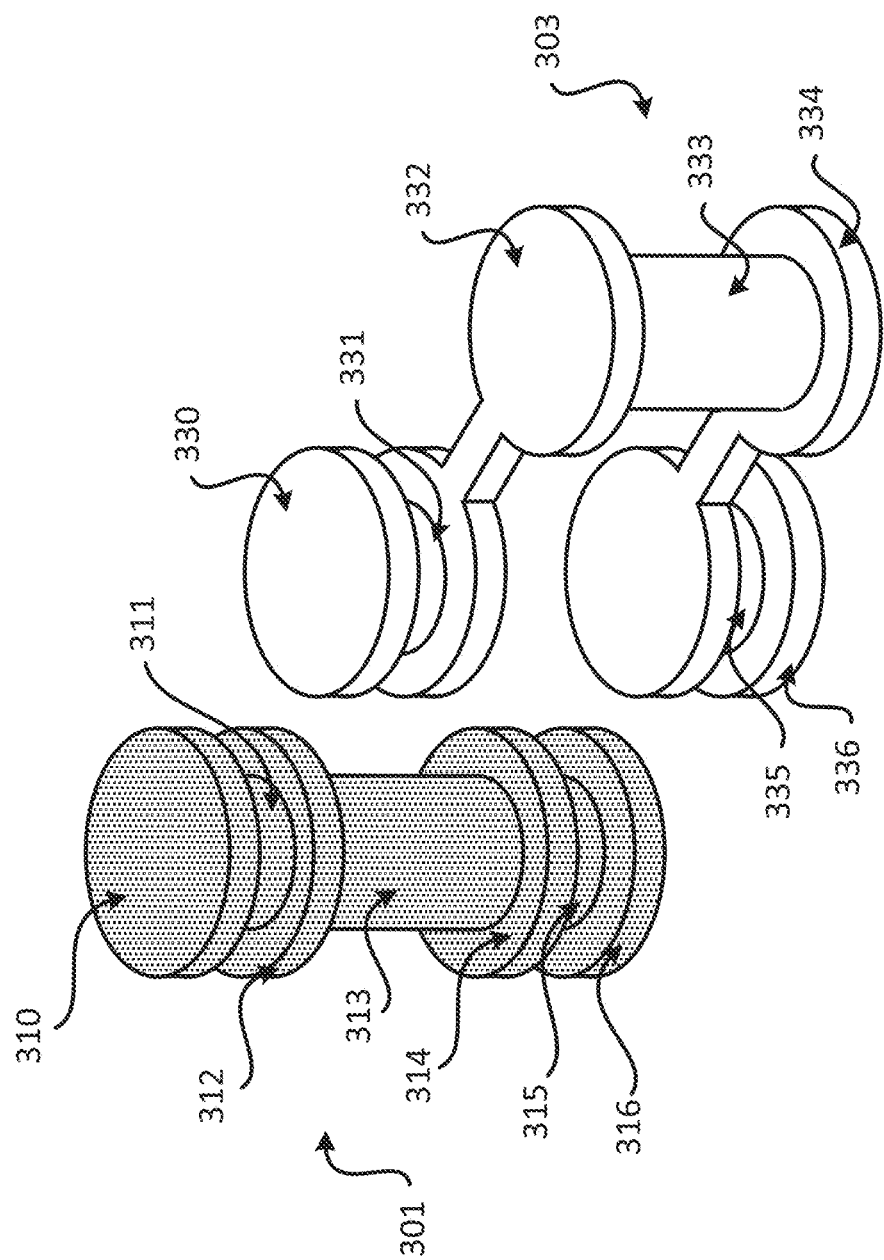
FIG. 3 illustrates a view of a pair of interconnects configured for skew matching.

FIG. 3 illustrates an exemplary pair of interconnects that are part of a differential signaling pair. FIG. 3 illustrates a first plurality of interconnects 301 and a second plurality of interconnects 303. The first plurality of interconnects 301 may be a representation of the first plurality of match interconnects 251 and/or the first plurality of match interconnects 271. The first plurality of interconnects 303 may be a representation of the second plurality of match interconnects 253 and/or the second plurality of match interconnects 273.

The first plurality of interconnects 301 includes an interconnect 310 (e.g., pad), an interconnect 311 (e.g., via), an interconnect 312 (e.g., pad), an interconnect 313 (e.g., via), an interconnect 314 (e.g., pad), an interconnect 315 (e.g., via), and an interconnect 316 (e.g., pad). The plurality of interconnects 301 extend vertically. In some implementations, the first plurality of interconnects 301 is part of a first electrical path between two first terminals (e.g., first terminal of a first integrated device and a first terminal of a second integrated device).

The second plurality of interconnects 303 includes an interconnect 330 (e.g., pad), an interconnect 331 (e.g., via), an interconnect 332 (e.g., trace, pads), an interconnect 333 (e.g., via), an interconnect 334 (e.g., trace, pads), an interconnect 335 (e.g., via), and an interconnect 336 (e.g., pad). The plurality of interconnects 303 extend vertically and horizontally. In some implementations, the second plurality of interconnects 303 is part of a second electrical path between two second terminals (e.g., second terminal of a first integrated device and a second terminal of a second integrated device).

Figure 4:
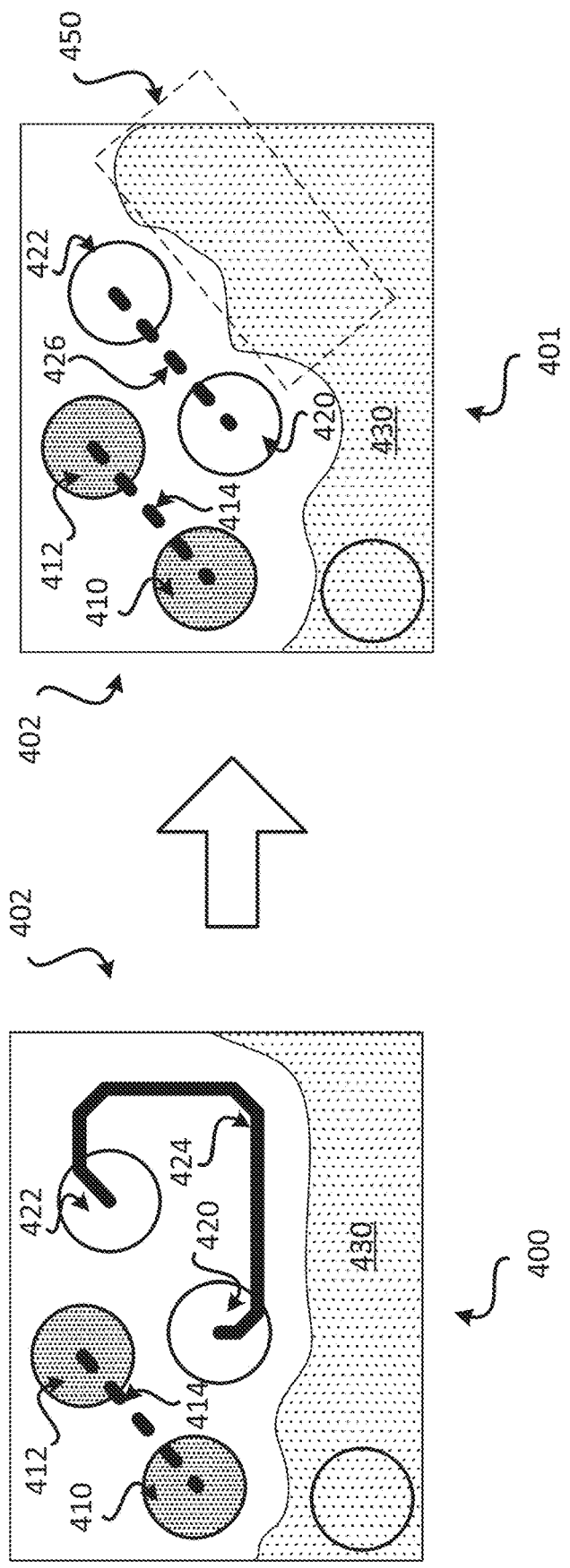
FIG. 4 illustrates a view of how a pair of interconnects may be configured for skew matching.

FIG. 4 illustrates how implementing a match structure helps improve a package and/or a substrate. FIG. 4 illustrates a first design 400 of the substrate 402, and a second design 401 of the substrate 402. The design 400 of the substrate 402 includes a at least one interconnect 410, at least one interconnects 412, a plurality of interconnects 414, at least one interconnect 420, at least one interconnect 422, a plurality of interconnects 424, and a solder resist layer 430. The at least one interconnect 410 and the at least one interconnect 412 may include pads on various metal layers. The at least one interconnect 410, the at least one interconnect 412, and the plurality of interconnects 414 are part of a first electrical path for a first signal from a pair of differential signals. The at least one interconnect 420 and the at least one interconnect 422 may include pads on various metal layers. The at least one interconnect 420, the at least one interconnect 422, and the plurality of interconnects 424 are part of a second electrical path for a second signal from a pair of differential signals. The plurality of interconnects 424 is formed on a dielectric layer of the substrate 402 to ensure that the overall length (e.g., effective length) of the second electrical path matches the overall length (e.g., effective length) of the first electrical path.

The design 401 of the substrate 402 includes the at least one interconnect 410, the at least one interconnect 412, the plurality of interconnects 414, the at least one interconnect 420, the at least one interconnect 422, a plurality of interconnects 426, and the solder resist layer 430. The design 401 may be similar to the design 400. However, the plurality of interconnects 424 of the design 400 has been implemented as the plurality of interconnects 426. The plurality of interconnects 426 may be implemented in the core layer of the substrate 402. The plurality of interconnects 426 may be implemented as the plurality of interconnects 303, the plurality of match interconnects 253, and/or the plurality of match interconnects 273.

The at least one interconnect interconnects 420, the at least one interconnect 422, and the plurality of interconnects 426 are part of a second electrical path for a second signal from a pair of differential signals. The plurality of interconnects 426 is formed in the core layer of the substrate 402 to ensure that the overall length (e.g., effective length) of the second electrical path matches the overall length (e.g., effective length) of the first electrical path. The design 401 creates a space 450 in the substrate 402, which can be used for routing of other interconnects. FIG. 4 illustrates how the serpentine design in a core layer can lead to improved overall routing of interconnects in a substrate, by creating additional spaces for any additional interconnects for the circuit.

Figure 5:
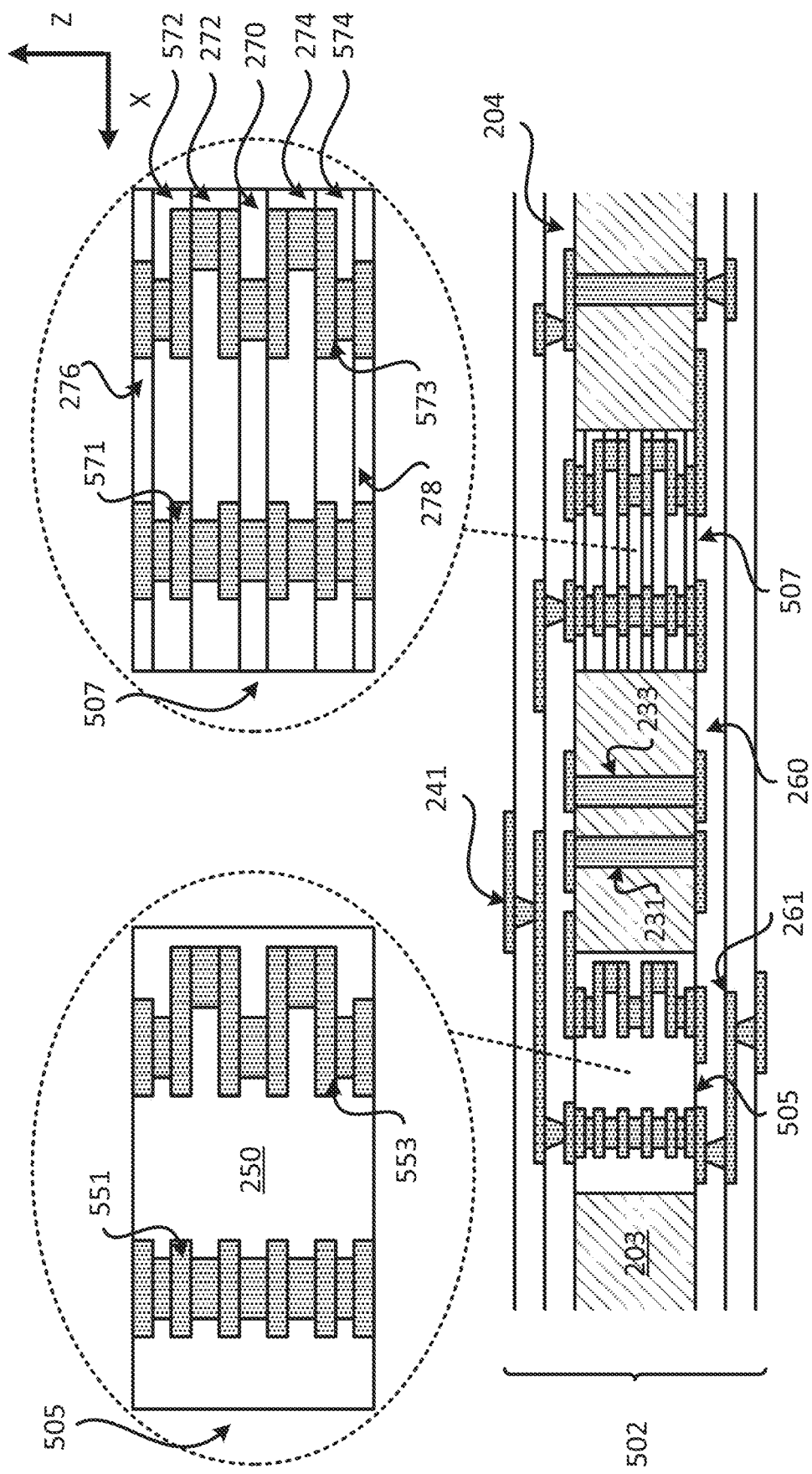
FIG. 5 illustrates a profile view of an exemplary substrate that includes interconnects in the core layer configured for skew matching.

Different match structures may have different designs and/or shapes. FIG. 5 illustrates a substrate 502 that includes at least one match structure with interconnects configured to provide skew matching and/or signal time matching. The substrate 502 may be implemented in a package with at least one integrated device. The substrate 502 is similar to the substrate 202, as described in FIG. 2. The substrate 502 may include the same or similar components as the substrate 202. The substrate 502 includes match structures that are different than the match structures described for the substrate 202.

As shown in FIG. 5, the substrate 502 includes a match structure 505 and a match structure 507. The match structure 505 and/or the match structure 507 may be a means for skew matching. The match structures 505 and 507 include interconnects with a different design than the interconnects of the match structures 205 and/or 207. For example, the match structures 205 and/or 207 includes interconnects with a different number of turns. The match structures 505 and 507 are located in the core layer 203. The match structures 505 and/or 507 are coupled to the first plurality of interconnects 241 and/or the second plurality of interconnects 261.

The match structure 505 includes at least one dielectric layer 250, a first plurality of match interconnects 551, and a second plurality of match interconnects 553. The first plurality of match interconnects 551 extends (e.g., vertically extends) through the at least one dielectric layer 250 of the match structure 505. The second plurality of match interconnects 553 extends (e.g., vertically and/or horizontally extends) through the at least one dielectric layer 250 of the match structure 505.

The first plurality of match interconnects 551 and the second plurality of match interconnects 553 are a differential pair of interconnects. The first plurality of match interconnects 551 is configured to provide an electrical path for a first signal. The second plurality of match interconnects 553 is configured to provide an electrical path for a second signal. The first signal and the second signal may be high speed signals. The first signal and the second signal may be a pair of differential signals. The first signal may be a positive signal, and the second signal may be a negative signal. The second signal may be a positive signal, and the first signal may be a negative signal. The second signal may be an opposite signal to the first signal, and vice versa. The second signal may be an inverted signal to the first signal, and vice versa.

The first plurality of match interconnects 551 has a first electrical path length. The second plurality of match interconnects 553 has a second electrical path length. The first plurality of match interconnects 551 has a lower electrical path length, than the electrical path length of the second plurality of match interconnects 553. The first plurality of match interconnects 551 is part of a first electrical path between two first terminals. The second plurality of match interconnects 553 is part of a second electrical path between two second terminals. The second plurality of match interconnects 553 may have a serpentine design with various turns. The match structure 505 helps ensure that the first electrical path length between two first terminals is the same or approximately the same as the second electrical path length between two second terminals. The two first terminals may be a pair of terminals between two integrated devices. The two second terminals may be a pair of terminals between the same two integrated devices. The two integrated devices may be coupled to the substrate 502, other substrates and/or a board (e.g., printed circuit board).

The match structure 507 includes a structure core layer 270, a dielectric layer 272, a dielectric layer 274, a dielectric layer 276, a dielectric layer 278, a dielectric layer 572 (e.g., structure dielectric layer), a dielectric layer 574 (e.g., structure dielectric layer), a first plurality of match interconnects 571, and a second plurality of match interconnects 573. The first plurality of match interconnects 571 extends (e.g., vertically extends) through the at least one dielectric layer of the match structure 507. The second plurality of match interconnects 573 extends (e.g., vertically and/or horizontally extends) through the dielectric layers of the match structure 507.

The first plurality of match interconnects 571 and the second plurality of match interconnects 573 are a differential pair of interconnects. The first plurality of match interconnects 571 is configured to provide an electrical path for a third signal. The second plurality of match interconnects 573 is configured to provide an electrical path for a fourth signal. The third signal and the fourth signal may be high speed signals. The third signal and the fourth signal may be a pair of differential signals. The third signal may be a positive signal, and the fourth signal may be a negative signal. The fourth signal may be a positive signal, and the third signal may be a negative signal. The fourth signal may be an opposite signal to the third signal, and vice versa. The fourth signal may be an inverted signal to the third signal, and vice versa.

The first plurality of match interconnects 571 has a third electrical path length. The second plurality of match interconnects 573 has a fourth electrical path length. The third plurality of match interconnects 571 has a lower electrical path length, than the electrical path length of the second plurality of match interconnects 573. The first plurality of match interconnects 571 is part of a third electrical path between two first terminals. The second plurality of match interconnects 573 is part of a fourth electrical path between two second terminals. The second plurality of match interconnects 573 may have a serpentine design with various turns. The match structure 507 helps ensure that the third electrical path length between two first terminals is the same or approximately the same as the fourth electrical path length between two second terminals. The two first terminals may be a pair of terminals between two integrated devices. The two second terminals may be a pair of terminals between the same two integrated devices. The two integrated devices may be coupled to the substrate 502, other substrates and/or board (e.g., printed circuit board).

Figure 6:
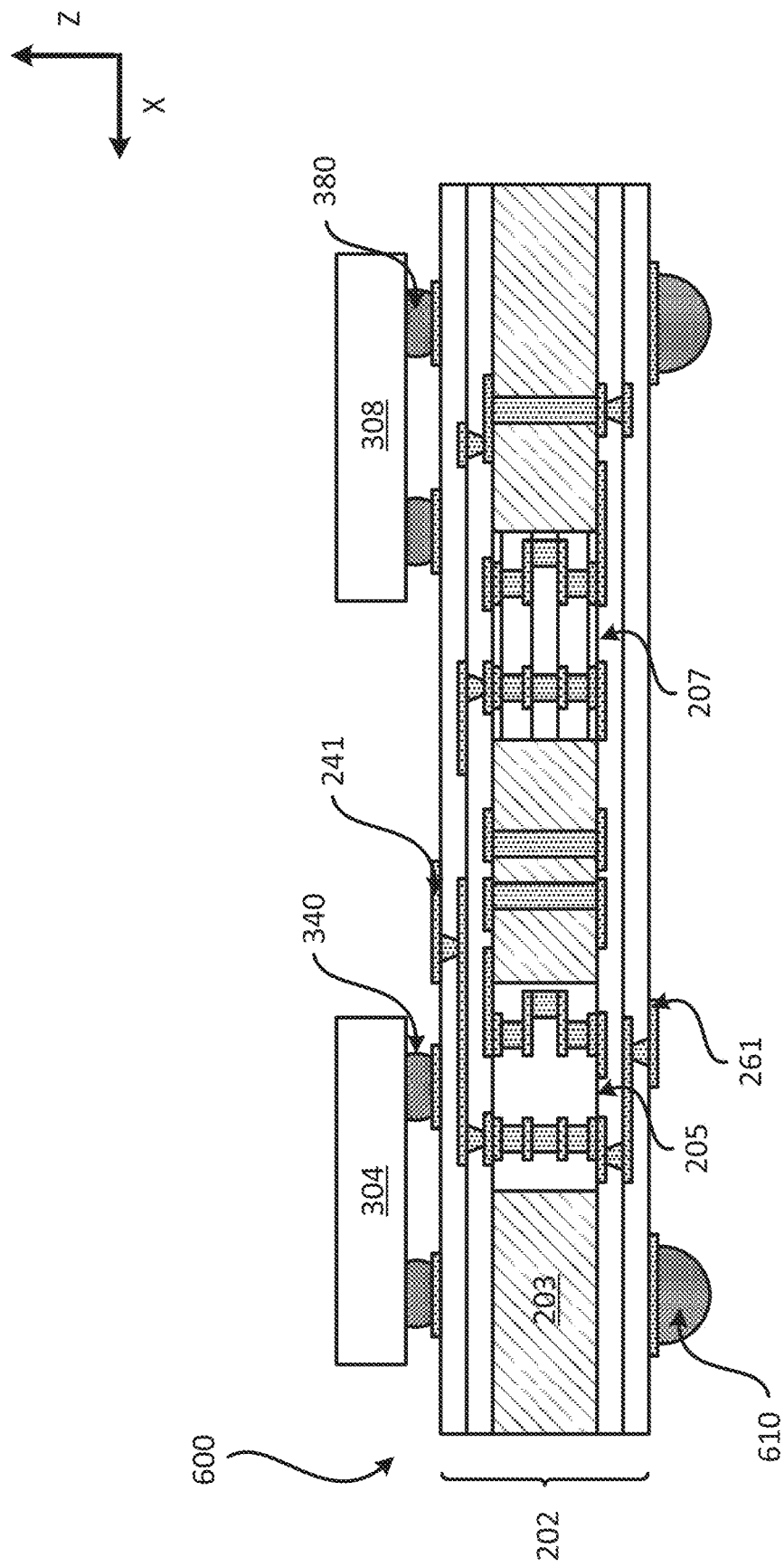
FIG. 6 illustrates a profile view of an exemplary package that includes a substrate that includes interconnects in the core layer configured for skew matching.

FIG. 6 illustrates a package 600 that includes the substrate 202, an integrated device 304 and an integrated device 308. The integrated device 304 is coupled to the substrate 202 through the plurality of solder interconnects 340. The integrated device 308 is coupled to the substrate 202 through the plurality of solder interconnects 380.

In some implementations, the integrated device 304 may be configured to be electrically coupled to another integrated device through the match structure 205 by way of differential signaling pair. For example, the integrated device 304 may be configured to be electrically coupled to the plurality of solder interconnects 340, the first plurality of interconnects 241, the interconnects of the match structure 205 and the second plurality of interconnects 261. The match structure 205 may be configured to provide skew matching and/or signal time matching for a pair of signals traveling to and/or from the integrated device 304. For example, the match structure 205 helps ensure that a first signal traveling to the integrated device 304 arrives at the same time as a second signal traveling to the integrated device 304, where the first signal and the second signal are a pair of differential signals. In another example, the match structure 205 helps ensure that a first signal traveling from the integrated device 304 arrives at another integrated device, at the same time as a second signal traveling from the integrated device 304, where the first signal and the second signal are a pair of differential signals. The other integrated device that is configured to receive and/or transmit the first signal and the second signal from/to the integrated device 304 through the match structure 205 may be coupled to the substrate 302, another substrate, or a board (e.g., printed circuit board).

In some implementations, the integrated device 308 may be configured to be electrically coupled to another integrated device through the match structure 207 by way of differential signaling pair. For example, the integrated device 308 may be configured to be electrically coupled to the plurality of solder interconnects 380, the second plurality of interconnects 241, the interconnects of the match structure 207 and the second plurality of interconnects 261. The match structure 207 may be configured to provide skew matching and/or signal time matching for a pair of signals traveling to and/or from the integrated device 308. For example, the match structure 207 helps ensure that a first signal traveling to the integrated device 308 arrives at the same time as a second signal traveling to the integrated device 308, where the first signal and the second signal are a pair of differential signals. In another example, the match structure 207 helps ensure that a first signal traveling from the integrated device 308 arrives at another integrated device, at the same time as a second signal traveling from the integrated device 308, where the first signal and the second signal are a pair of differential signals. The other integrated device that is configured to receive and/or transmit the first signal and the second signal from/to the integrated device 308 through the match structure 207 may be coupled to the substrate 302, another substrate, or a board (e.g., printed circuit board).

It is noted that any of the substrates (e.g., 502) described in the disclosure may be implemented with the package. It is also noted that any of the match structures (e.g., 205, 207, 505, 507) may be implemented in a substrate. It is also noted that a substrate may include any number of match structures and/or different combinations of different match structures. Having described various substrates with various match structures, a process for fabricating a substrate will now be described below.

Exemplary Sequence for Fabricating a Substrate that Includes a Match Structure

In some implementations, fabricating a substrate that includes a match structure includes several processes. FIGS. 7A-7D illustrate an exemplary sequence for providing or fabricating a substrate that includes at least one match structure. In some implementations, the sequence of FIGS. 7A-7D may be used to provide or fabricate the substrate 202 of FIG. 2. However, the process of FIGS. 7A-7D may be used to fabricate any of the substrates described in the disclosure.

It should be noted that the sequence of FIGS. 7A-7D may combine one or more stages in order to simplify and/or clarify the sequence for providing or fabricating a substrate. In some implementations, the order of the processes may be changed or modified. In some implementations, one or more of processes may be replaced or substituted without departing from the spirit of the disclosure.

Figure 7A:
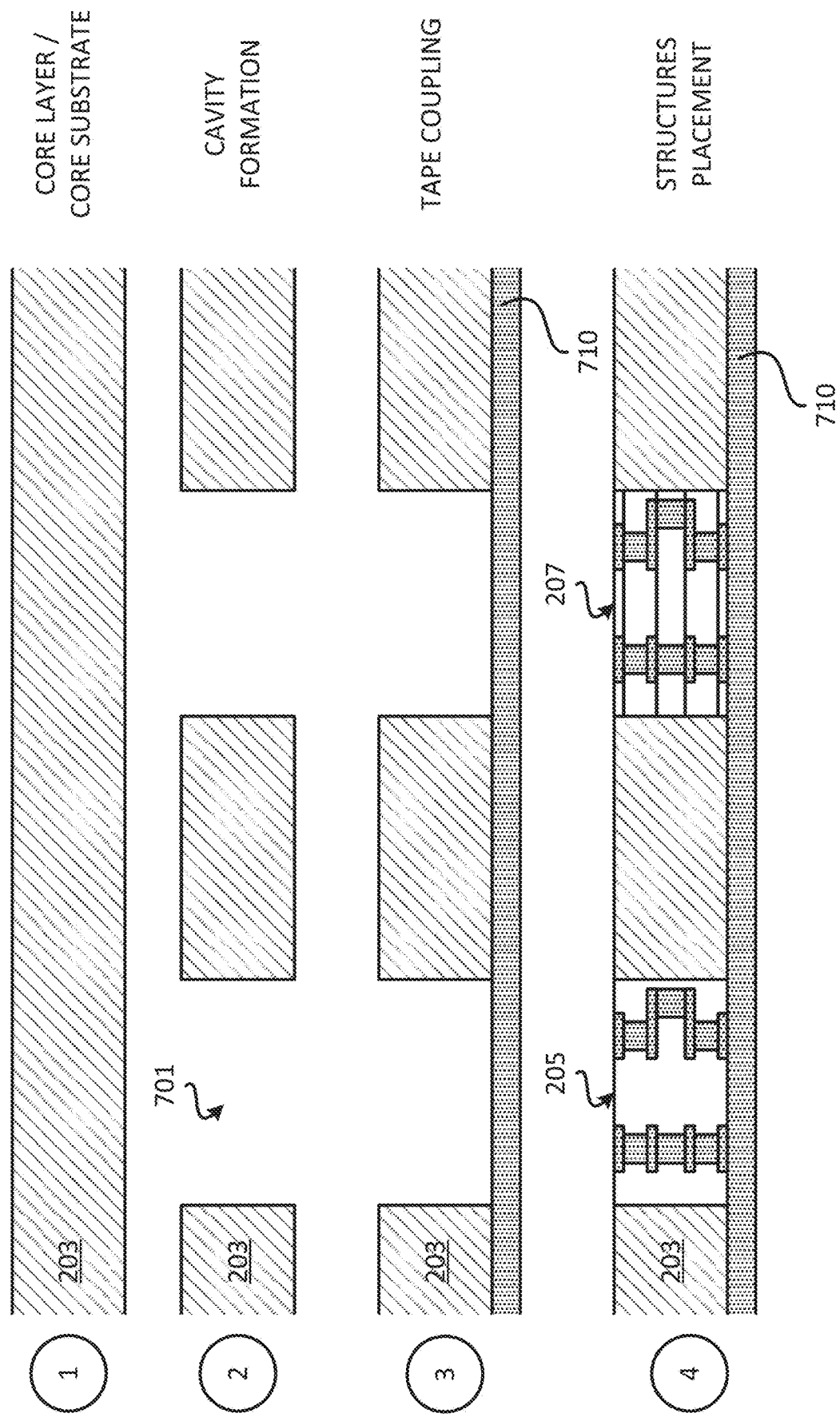
FIGS. 7A-7D illustrate an exemplary sequence for fabricating a substrate that includes interconnects in the core layer configured for skew matching.

Stage 1, as shown in FIG. 7A, illustrates a state after a core layer 203 is provided. The core layer 203 may include metal layers (e.g., foil).

Stage 2 illustrates a state after a plurality of cavities 701 is formed in the core layer 203. The plurality of cavities 701 may extend through the core layer 203. A laser process (e.g., laser ablation) may be used to form the plurality of cavities 701.

Stage 3 illustrates a state after the core layer 203 is coupled to a tape 710, or vice versa. The tape 710 may include an adhesive tape.

Stage 4 illustrates a state after at least one match structure 205 is placed in the cavity 701, and at least one match structure 207 is placed in another cavity 701. Different implementations may place different match structures (e.g., 505, 507) in the cavities 701. Different implementations may place a different number of match structures and/or different combination of match structures in the cavities. A pick and place process may be used to place the match structures in the cavities 701 of the core layer 203. Examples of how match structures are fabricated are illustrated and described in FIGS. 9A-9D and/or FIGS. 10A-10F.

Figure 7B:
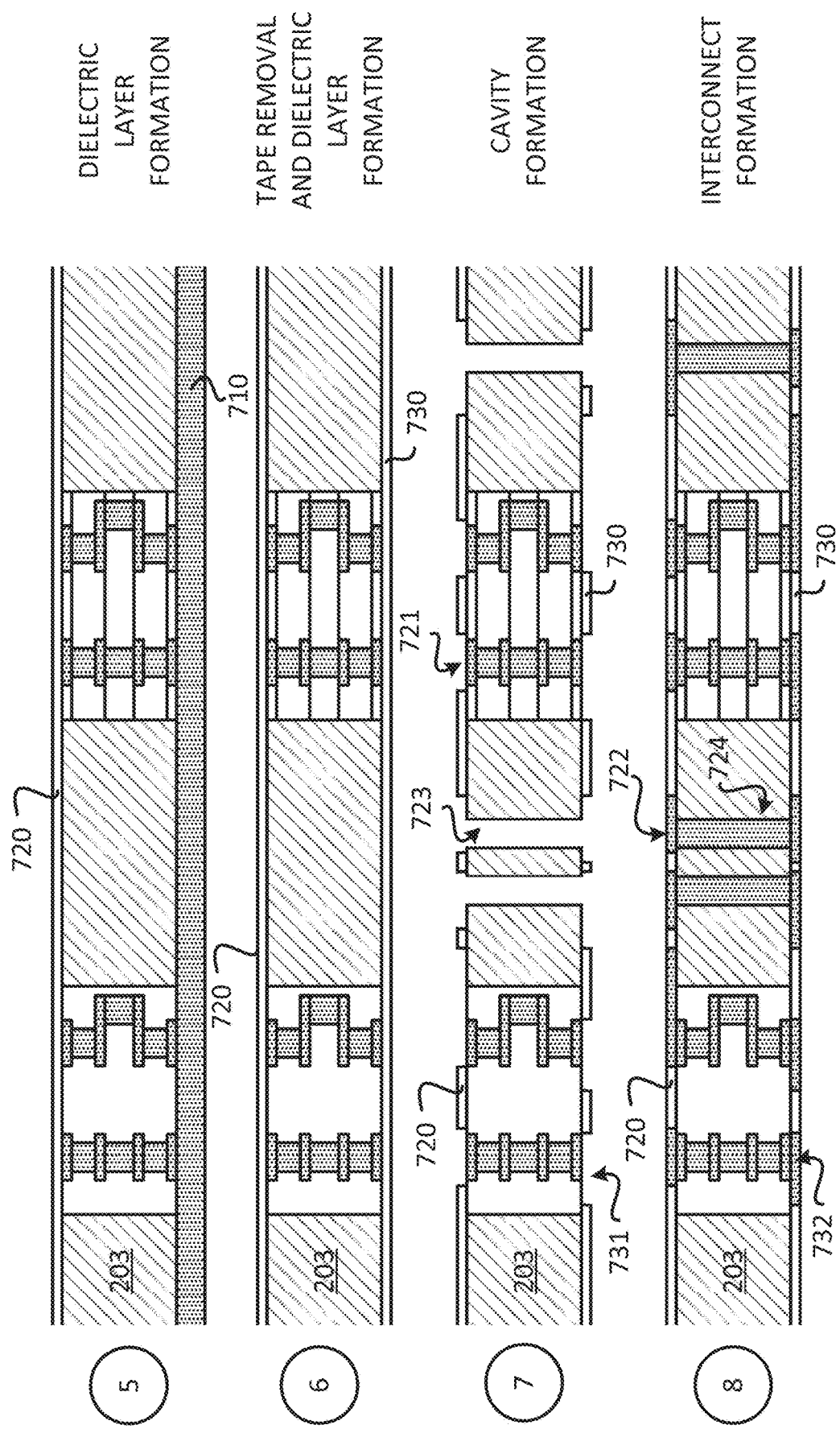

Stage 5, as shown in FIG. 7B, illustrates a state after a dielectric layer 720 is formed over a first surface (e.g., top surface) of the core layer 203, the match structure 205 and the match structure 207. A deposition process may be used to form the dielectric layer 720.

Stage 6 illustrates a state after the tape 710 is decoupled from the core layer 203, and a dielectric layer 730 is formed over a second surface (e.g., bottom surface) of the core layer 203, the match structure 205 and the match structure 207. A deposition process may be used to form the dielectric layer 730.

Stage 7 illustrates a state after a plurality of cavities 721 is formed through the dielectric layer 720, a plurality of cavities 723 is formed through the core layer 203, and a plurality of cavities 733 is formed through the dielectric layer 730. A laser process (e.g., laser ablation) may be used to form the cavities.

Stage 8 illustrates a state after a plurality of interconnects 722, a plurality of interconnects 732, and a plurality of interconnects 724 are formed. The plurality of interconnects 724 is formed in the cavities 723. A plating process or a pasting process may be used to form the interconnects 722, 724, and/or 732.

Figure 7C:
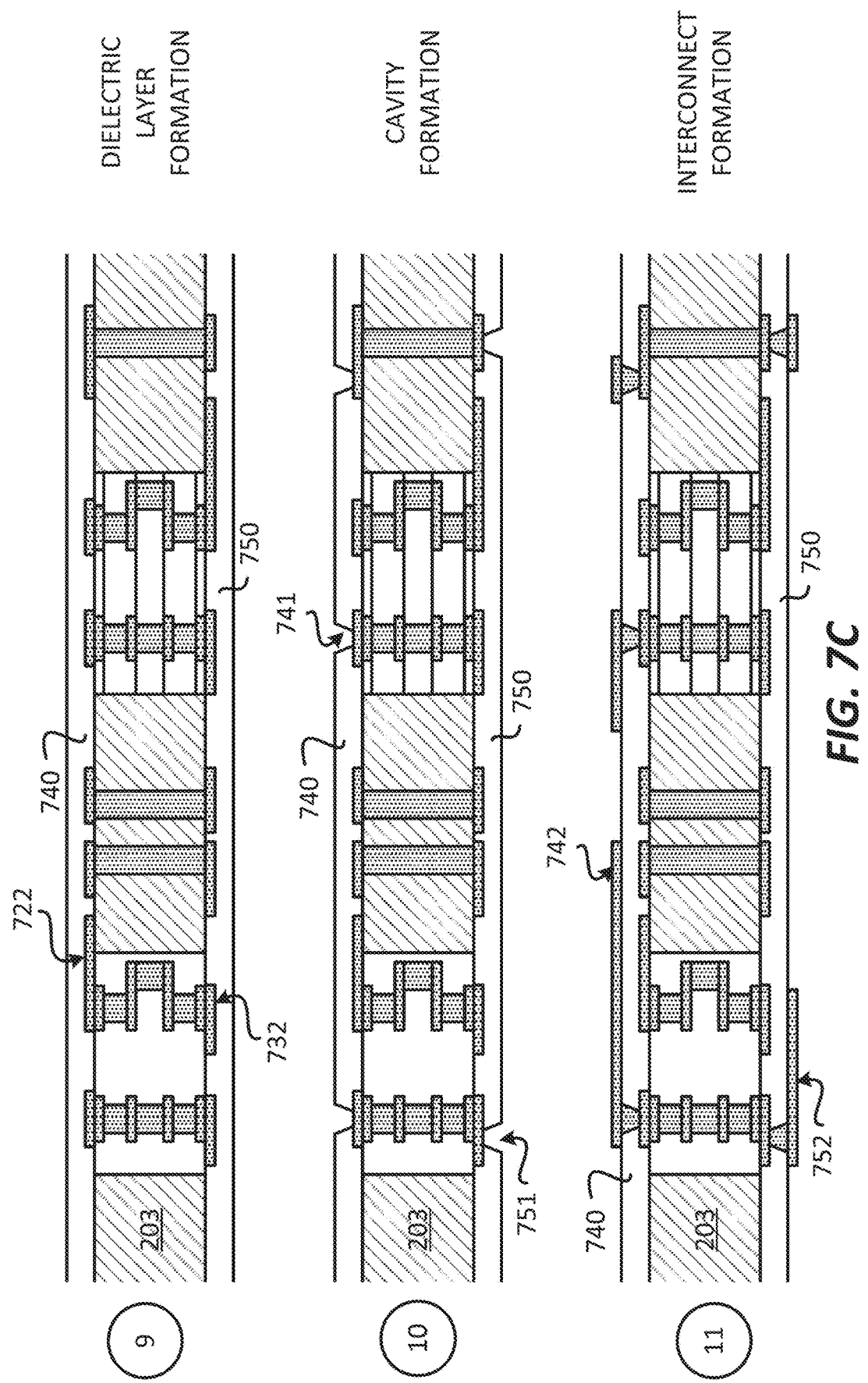

Stage 9, as shown in FIG. 7C, illustrates a state after a dielectric layer 740 is formed and a dielectric layer 750 is formed. A deposition process may be used to form the dielectric layer 740. The dielectric layer 740 may include the dielectric layer 720. A deposition process may be used to form the dielectric layer 750. The dielectric layer 750 may include the dielectric layer 730.

Stage 10 illustrates a state after a plurality of cavities 741 is formed in the dielectric layer 740 and a plurality of cavities 751 is formed in the dielectric layer 750. A laser process (e.g., laser ablation), a lithography process (e.g., exposure and development), and/or an etching process may be used to form the cavities 741 and 751.

Stage 11 illustrates a state after (i) a plurality of interconnects 742 is formed in and/or over the dielectric layer 740, and (ii) a plurality of interconnects 752 is formed in and/or over the dielectric layer 750. A patterning process and a plating process may be used to form the interconnects 742 and 752. Some of the interconnects 742 may be formed in the cavities 741. Some of the interconnects 752 may be formed in the cavities 751. The plurality of interconnects 742 and 752 may include vias, pads and/or traces.

Figure 7D:
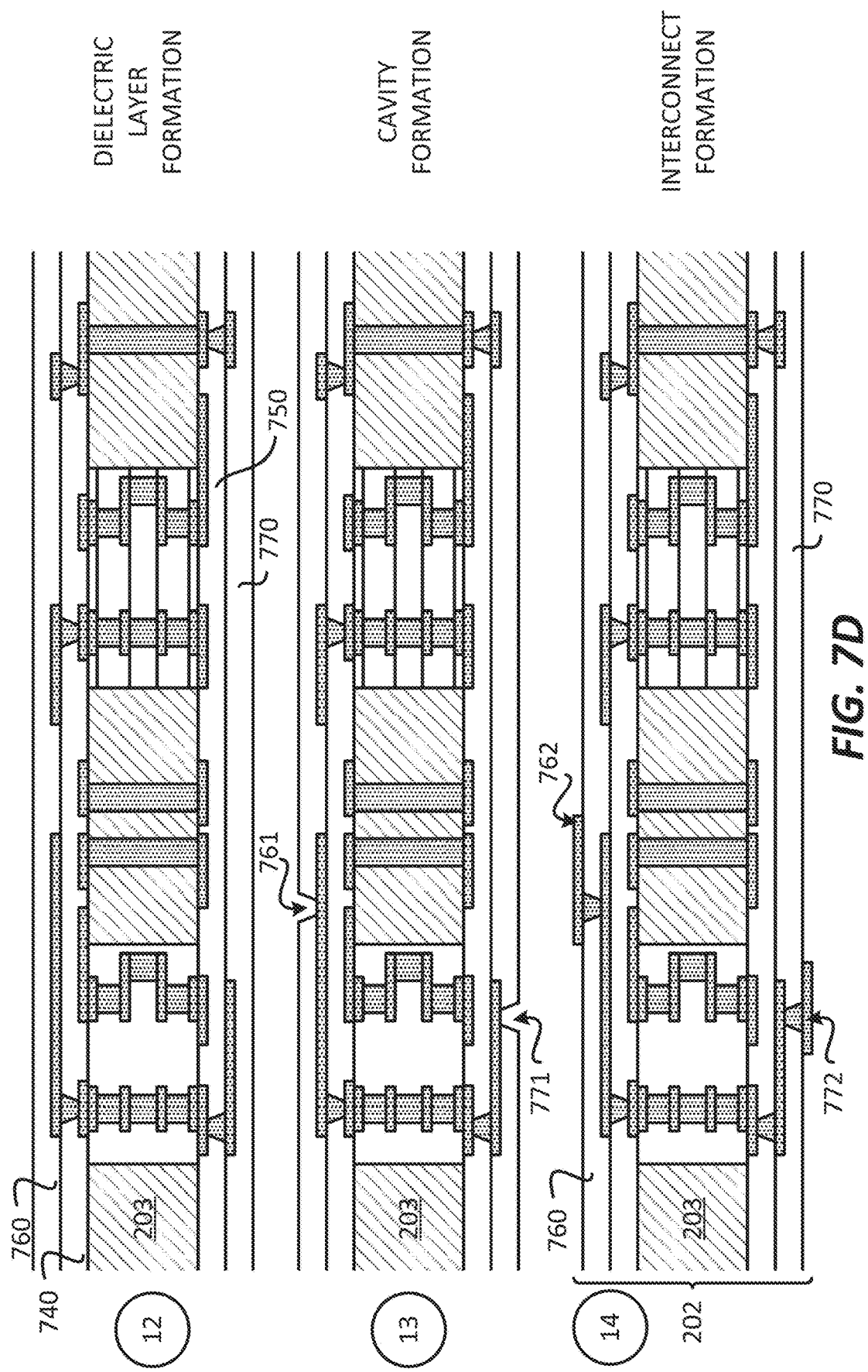

Stage 12, as shown in FIG. 7D, illustrates a state after a dielectric layer 760 is formed and a dielectric layer 770 is formed. The dielectric layer 760 is formed over the dielectric layer 740. The dielectric layer 770 is formed over the dielectric layer 750. A deposition process may be used to form the dielectric layer 760. A deposition process may be used to form the dielectric layer 770.

Stage 13 illustrates a state after a plurality of cavities 761 is formed in the dielectric layer 760 and a plurality of cavities 771 is formed in the dielectric layer 770. A laser process (e.g., laser ablation), a lithography process (e.g., exposure and development), and/or an etching process may be used to form the cavities 761 and 771.

Stage 14 illustrates a state after (i) a plurality of interconnects 762 is formed in and/or over the dielectric layer 760, and (ii) a plurality of interconnects 772 is formed in and/or over the dielectric layer 770. A patterning process and a plating process may be used to form the interconnects 762 and 772. Some of the interconnects 762 may be formed in the cavities 761. Some of the interconnects 772 may be formed in the cavities 771. The interconnects 762 and 772 may include vias, pads and/or traces.

Stage 14 may illustrate the substrate 202 that includes the match structure 205 and the match structure 207. The dielectric layers 740 and 760 may be represented by the at least one first dielectric layer 240. The plurality of interconnects 742 and 762 may be represented by the first plurality of interconnects 241. The dielectric layers 750 and 770 may be represented by the at least one second dielectric layer 260. The plurality of interconnects 752 and 772 may be represented by the second plurality of interconnects 261.

Figure 8:
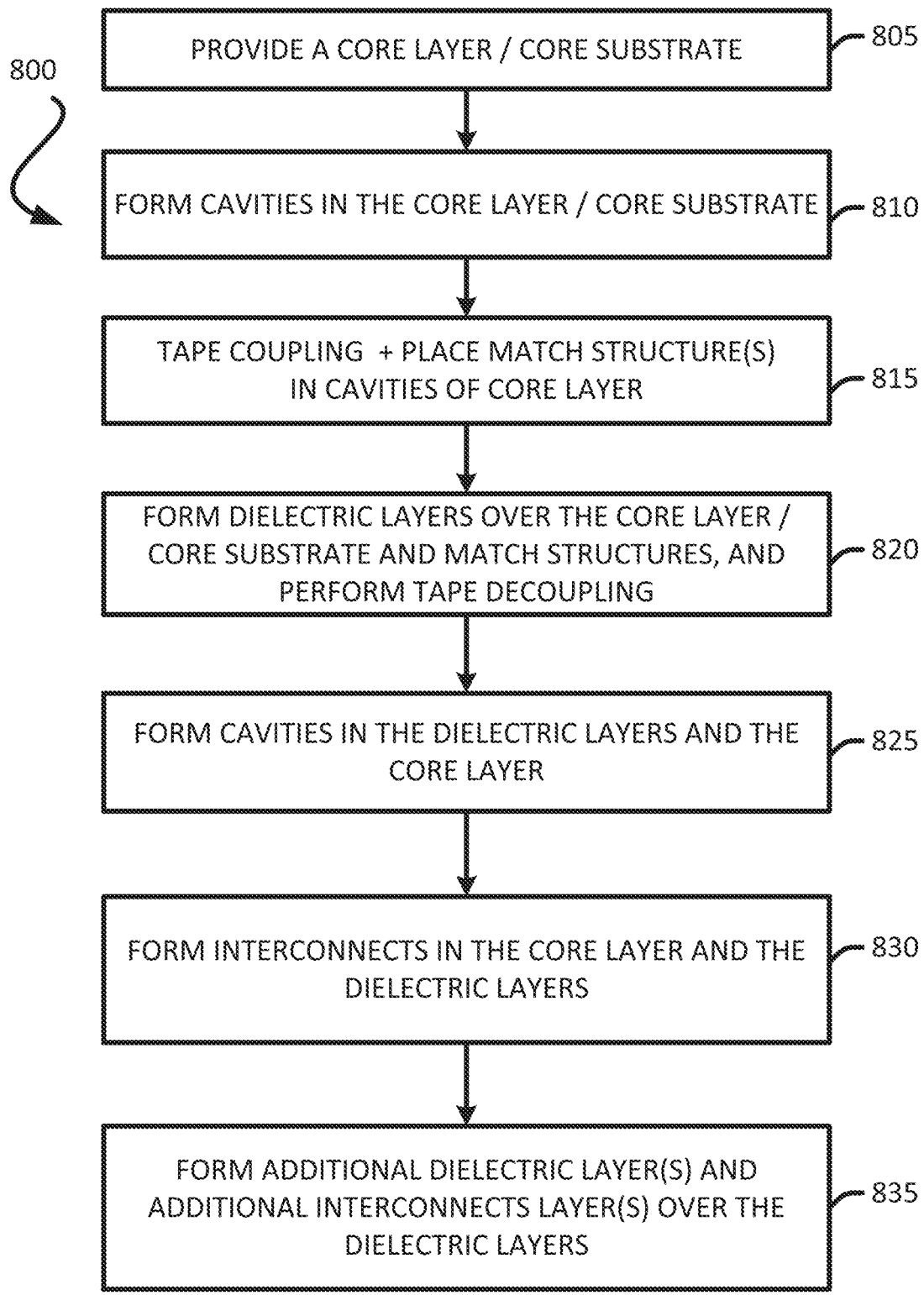
FIG. 8 illustrates an exemplary flow diagram of a method for fabricating a substrate that includes interconnects in the core layer configured for skew matching.

Exemplary Flow Diagram of a Method for Fabricating a Substrate that Includes a Match Structure In some implementations, fabricating a substrate that includes at least one match structure includes several processes. FIG. 8 illustrates an exemplary flow diagram of a method 800 for providing or fabricating a substrate that includes at least one match structure. In some implementations, the method 800 of FIG. 8 may be used to provide or fabricate the substrate 202 of FIG. 2. However, the method 800 may be used to fabricated any substrate described in the disclosure.

It should be noted that the sequence of FIG. 8 may combine one or more processes in order to simplify and/or clarify the method for providing or fabricating a substrate. In some implementations, the order of the processes may be changed or modified.

The method provides (at 805) a core layer (e.g., 203). The core layer may include at least one metal layer. The core layer may be a core substrate. Stage 1 of FIG. 7A, illustrates and describes an example of providing a core layer.

The method forms (at 810) a plurality of cavities 701 in the core layer 203. The plurality of cavities 701 may extend through the core layer 203. A laser process may be used to form the plurality of cavities 701. Stage 2 of FIG. 7A illustrates and describes an example of forming cavities in a core layer.

The method couples (at 815) a core layer 203 to a tape 710. Stage 3 of FIG. 7A illustrates and describes an example of coupling a core layer to a tape. The method also places (at 815) at least one match structure (e.g., 205, 207, 505, 507) in the cavities (e.g., 701) of the core layer 203. A pick and place process may be used to place the at least one match structure. Stage 4 of FIG. 7A illustrates and describes an example of placing match structures in cavities of a core layer.

The method forms (at 820) dielectric layer(s) over the core layer and match structures. A deposition process may be used to form the dielectric layer(s) (e.g., 720, 730). A dielectric layer may be formed over a first surface of the core layer 203 and a first surface of at least one match structure. Another dielectric layer may be formed over a second surface of the core layer 203 and a second surface of the at least one match structure. In some implementations, the tape (e.g., 710) may be decoupled from the core layer 203 before a dielectric layer is formed over a surface of the core layer. Stages 5-6 of FIG. 7B illustrate and describe an example of forming a dielectric layer and tape decoupling.

The method forms (at 825) forms cavities in the core layer (e.g., 203) and the dielectric layers (e.g., 720, 730). A laser process (e.g., laser ablation), a lithography process (e.g., exposure and development), and/or an etching process may be used to form the cavities (e.g., 721, 723, 731). Stage 7 of FIG. 7B illustrates and describes an example of forming cavities.

The method forms (at 830) interconnects in the core layer (e.g., 203) and the dielectric layers (e.g., 720, 730). A patterning process and a plating process may be used to form the interconnects (e.g., 722, 724, 732). Stage 8 of FIG. 7B illustrates and describes an example of forming interconnects.

The method forms (at 835) additional dielectric layers (e.g., 740, 760, 750, 770) and interconnects (e.g., 742, 752, 762, 772) over the dielectric layers (e.g., 720, 730). Forming the additional dielectric layers and the interconnects may include depositing dielectric layers, forming cavities in the dielectric layers and a plating process to form the interconnects. Stages 9-14 of FIGS. 7C-7D illustrate and describe forming additional dielectric layers and interconnects.

Exemplary Sequence for Fabricating a Match Structure

In some implementations, fabricating a match structure includes several processes. FIGS. 9A-9D illustrate an exemplary sequence for providing or fabricating a match structure. In some implementations, the sequence of FIGS. 9A-9D may be used to provide or fabricate the match structure 207 of FIG. 2. However, the process of FIGS. 9A-9D may be used to fabricate any of the match structures described in the disclosure.

It should be noted that the sequence of FIGS. 9A-9D may combine one or more stages in order to simplify and/or clarify the sequence for providing or fabricating a match structure. In some implementations, the order of the processes may be changed or modified. In some implementations, one or more of processes may be replaced or substituted without departing from the spirit of the disclosure.

Figure 9A:
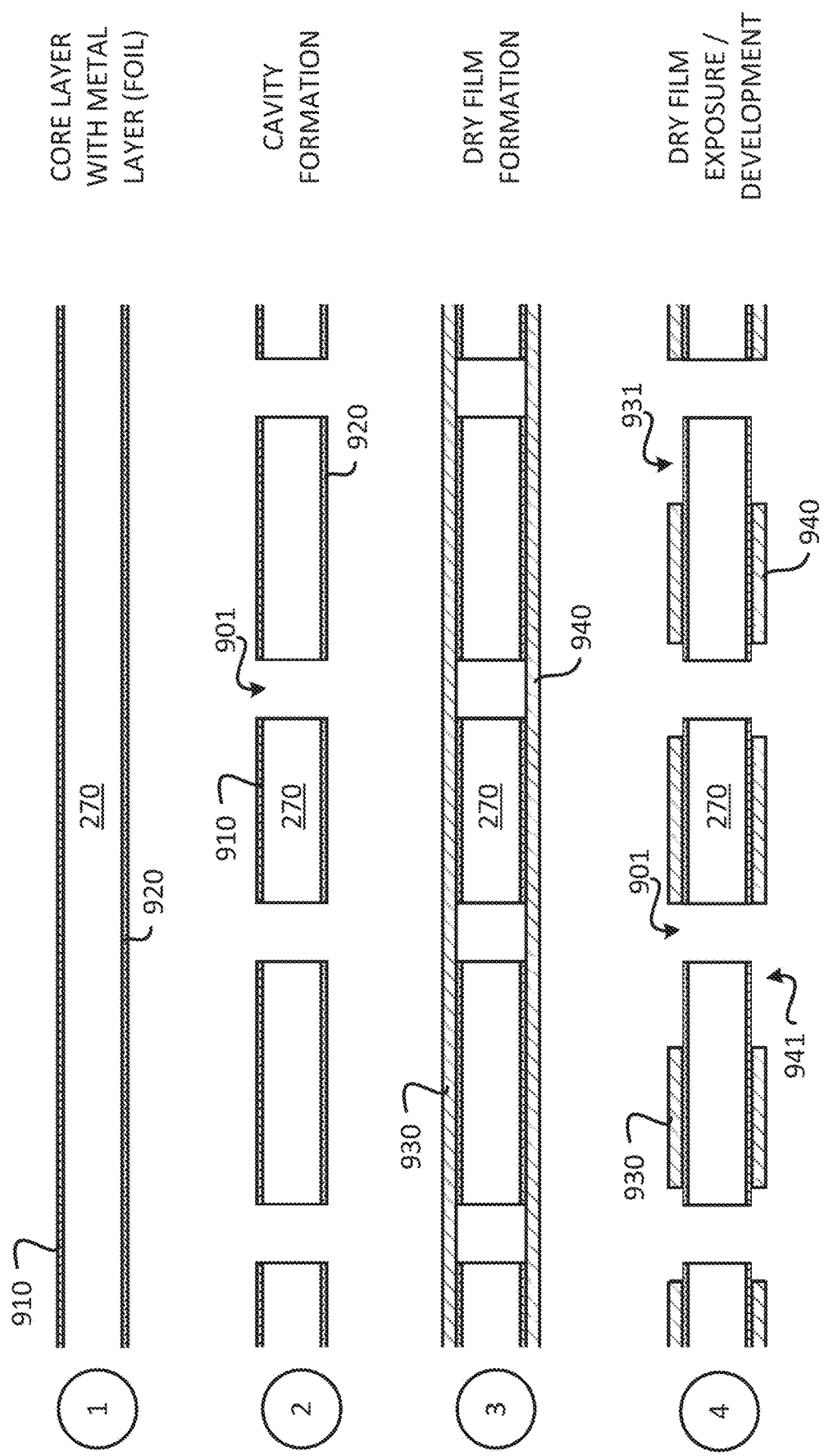
FIGS. 9A-9D illustrate an exemplary sequence for fabricating a match structure comprising a pair of interconnects configured for skew matching.

Stage 1, as shown in FIG. 9A, illustrates a state after a core layer 270 is provided. The core layer 270 may include metal layers (e.g., 910, 920)

Stage 2 illustrates a state after a plurality of cavities 901 is formed through the metal layer 910, the core layer 270, the metal layer 920. A laser process (e.g., laser ablation) may be used to form the cavities 901.

Stage 3 illustrates a state after a first dry film 930 is formed over a first surface of the core layer 270 and/or the metal layer 910. Stage 3 also illustrates a state after a second dry film 940 is formed over a second surface of the core layer 270 and/or the metal layer 920. A deposition process may be used to form the dry films (e.g., 930, 940).

Stage 4 illustrates a state after a plurality of cavities 901 is formed through the dry film 930, the metal layer 910, the core layer 270, the metal layer 920 and the dry film 940. Stage 4 also illustrates a state after a plurality of cavities 931 is formed through the dry film 930, and a plurality of cavities 941 is formed through the dry film 940. A laser process (e.g., laser ablation) may be used to form the cavities. Forming the cavities may include dry film exposure and development.

Figure 9B:
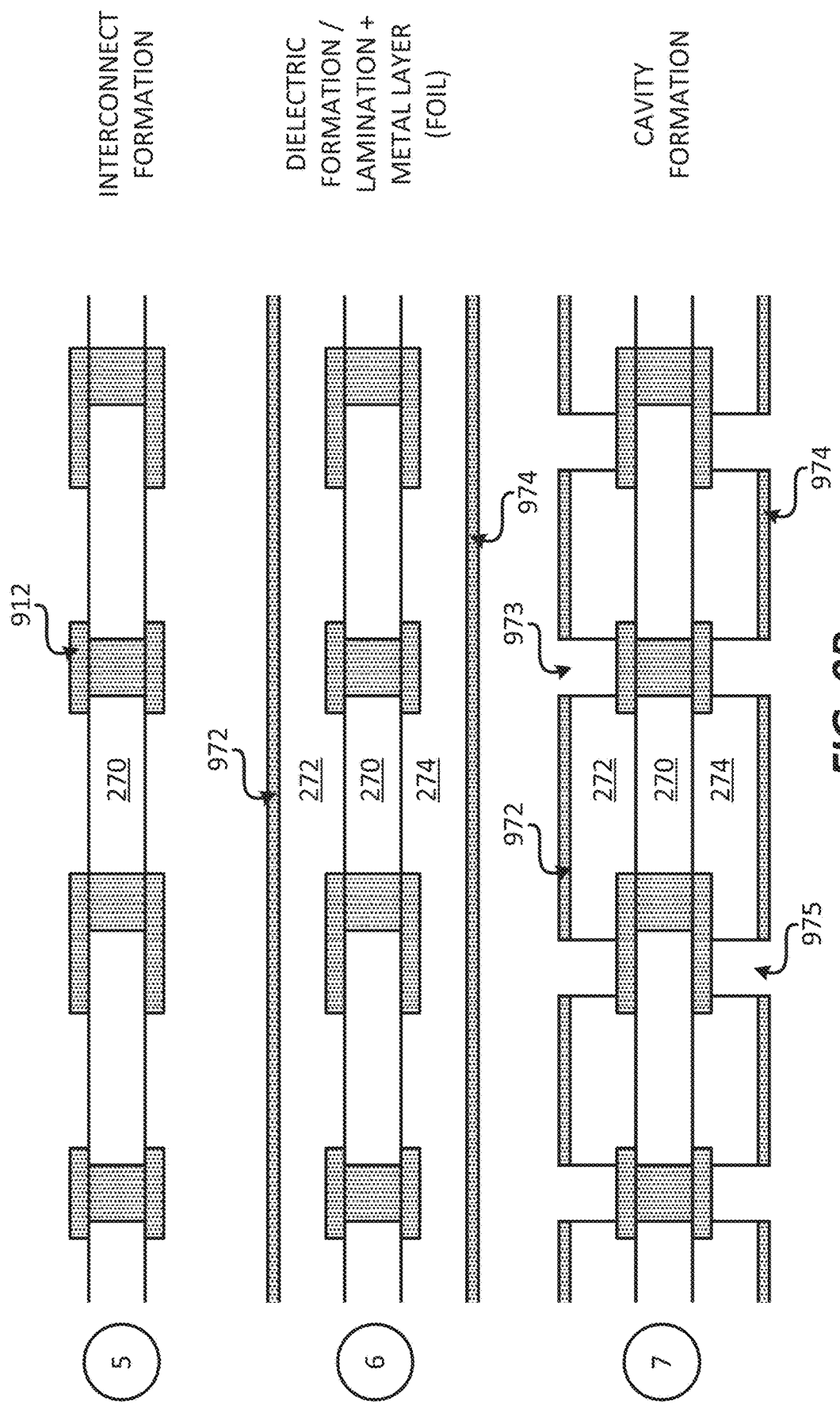

Stage 5, as shown in FIG. 9B, illustrates a state after a plurality of interconnects 912 is formed in and over the core layer 270. A plating process or a pasting process may be used to form the interconnects 912. Stage 5 illustrates a state after the dry films (e.g., 930, 940) are removed.

Stage 6 illustrates a state after a dielectric layer 272 is formed and a dielectric layer 274 is formed. A deposition process may be used to form the dielectric layer 272 and the dielectric layer 274. Stage 6 also illustrates a metal layer 972 formed over the dielectric layer 272, and a metal layer 974 formed over the dielectric layer 274. The metal layers 972 and 974 may include a foil.

Stage 7 illustrates a state after a plurality of cavities 973 is formed through the metal layer 972 and the dielectric layer 272. Stage 7 also illustrates a plurality of cavities 975 formed through the metal layer 974 and the dielectric layer 274. A laser process (e.g., laser ablation), a lithography process (e.g., exposure and development), and/or an etching process may be used to form the cavities 973 and 975.

Figure 9C:
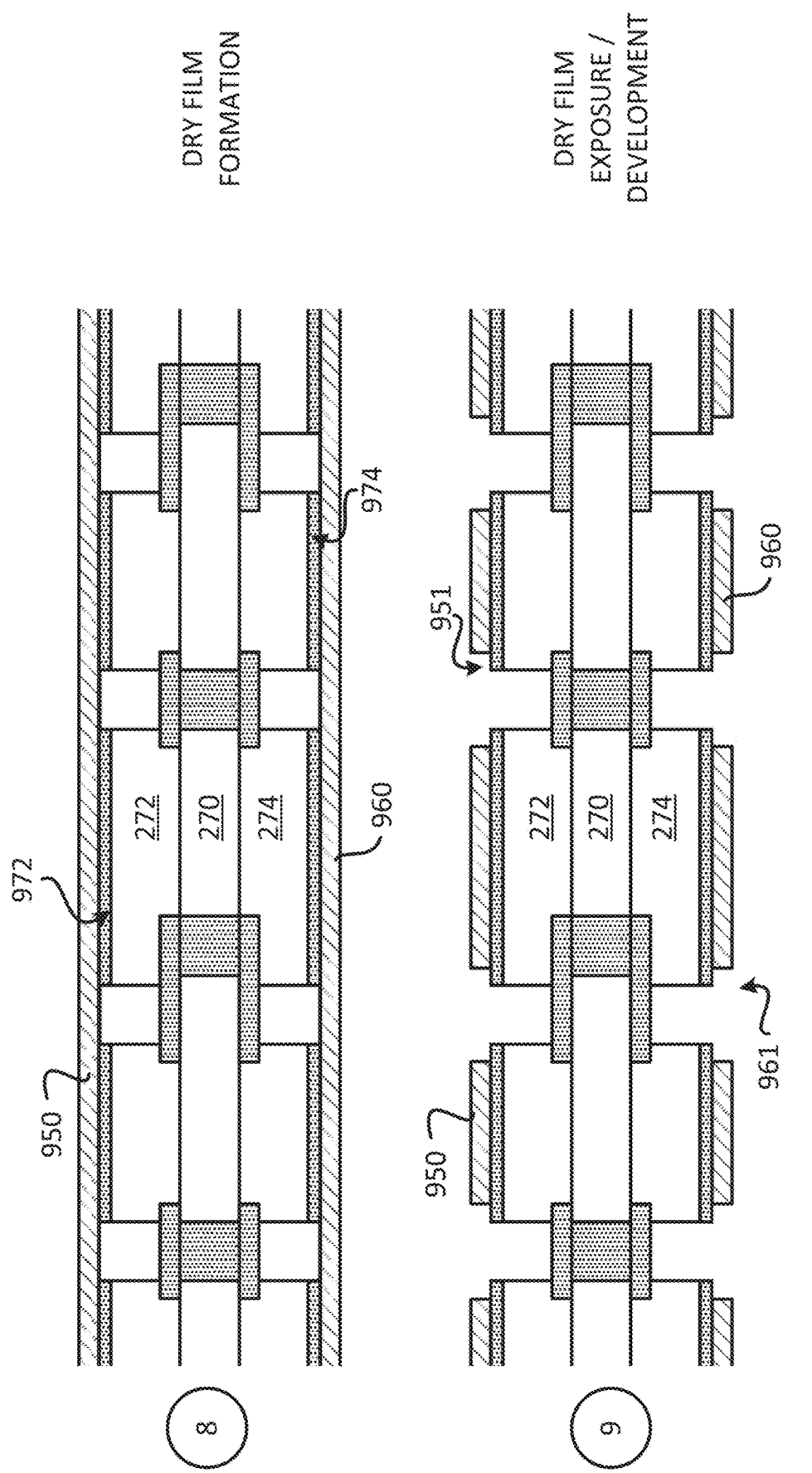

Stage 8, as shown in FIG. 9C illustrates a state after a first dry film 950 is formed over the dielectric layer 272 and the metal layer 972, and a second dry film 960 is formed over the dielectric layer 274 and the metal layer 974. A deposition process may be used to form the dry films (e.g., 950, 960).

Stage 9 illustrates a state after a plurality of cavities 951 is formed through the dry film 950, and a plurality of cavities 961 through the dry film 960. A laser process (e.g., laser ablation) may be used to form the cavities. Forming the cavities may include dry film exposure and development.

Figure 9D:
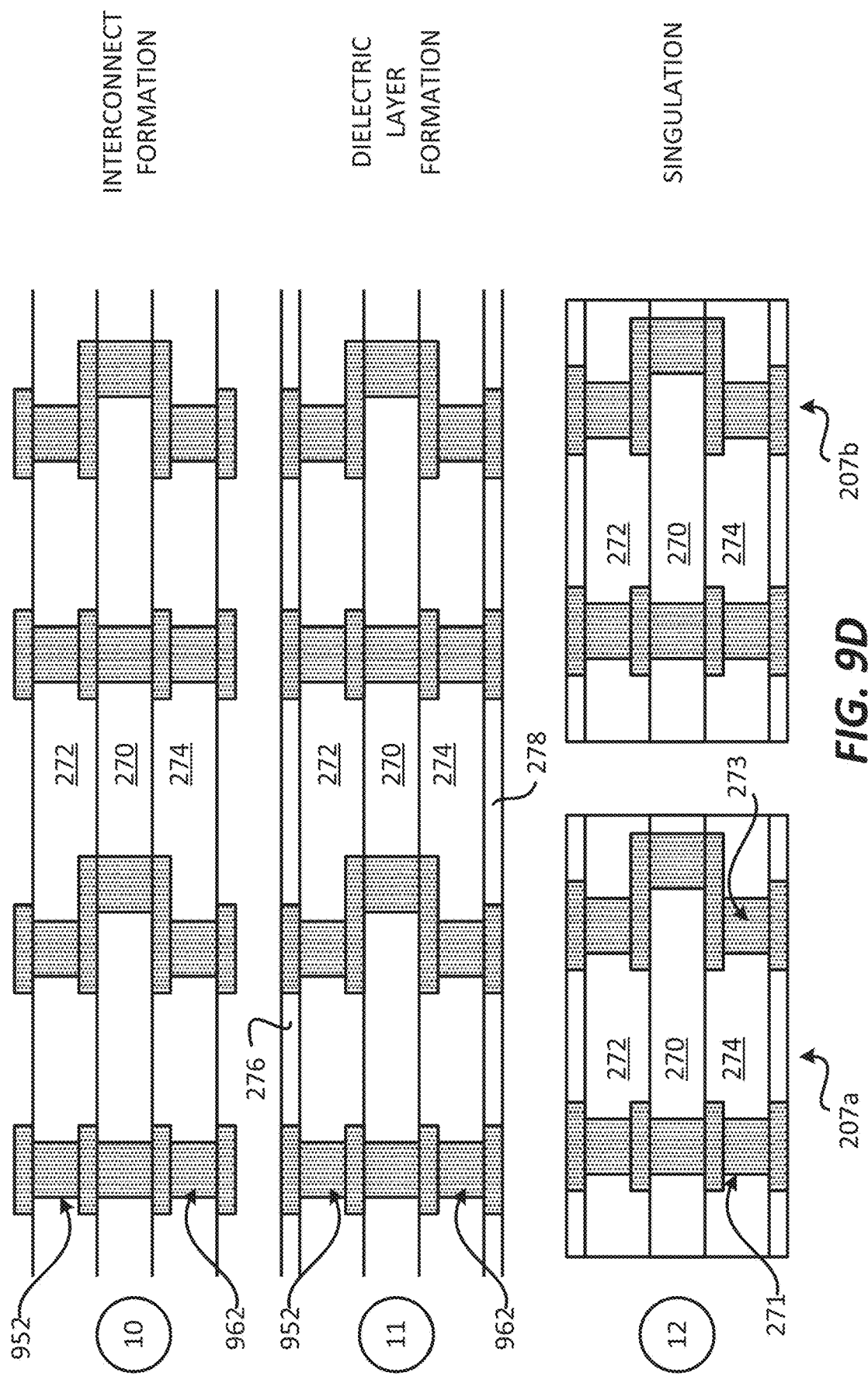

Stage 10, as shown in FIG. 9D, illustrates a state after a plurality of interconnects 952 is formed in and over the dielectric layer 272, and a plurality of interconnects 962 is formed in and over the dielectric layer 274. A plating process or a pasting process may be used to form the interconnects 952 and 962. Stage 10 illustrates a state after the dry films (e.g., 950, 960) are removed.

Stage 11 illustrates a state after a dielectric layer 276 is formed over the dielectric layer 272, and a dielectric layer 278 is formed over the dielectric layer 274. A deposition process may be used to form the dielectric layer 276 and the dielectric layer 278. The dielectric layers 272, 274, 276 and/or 278 may include prepreg. Vias in the dielectric layers 272 and/or 274 may have a thickness in a range of 25 micrometers to 80 micrometers. Vias in the core layer 270 may have a thickness in a range of 40 micrometers to 250 micrometers.

Stage 12 illustrates a state after singulation that forms several match structures, such as match structure 207a and match structure 207b. The match structure 207a includes the first plurality of match interconnects 271 and the second plurality of match interconnects 273. The match structure 207b includes the first plurality of match interconnects 271 and the second plurality of match interconnects 273.

Exemplary Sequence for Fabricating a Match Structure

In some implementations, fabricating a match structure includes several processes. FIGS. 10A-10F illustrate an exemplary sequence for providing or fabricating a match structure. In some implementations, the sequence of FIGS. 10A-10F may be used to provide or fabricate the match structure 205 of FIG. 2. However, the process of FIGS. 10A-10F may be used to fabricate any of the match structures described in the disclosure.

It should be noted that the sequence of FIGS. 10A-10F may combine one or more stages in order to simplify and/or clarify the sequence for providing or fabricating a match structure. In some implementations, the order of the processes may be changed or modified. In some implementations, one or more of processes may be replaced or substituted without departing from the spirit of the disclosure.

Figure 10A:
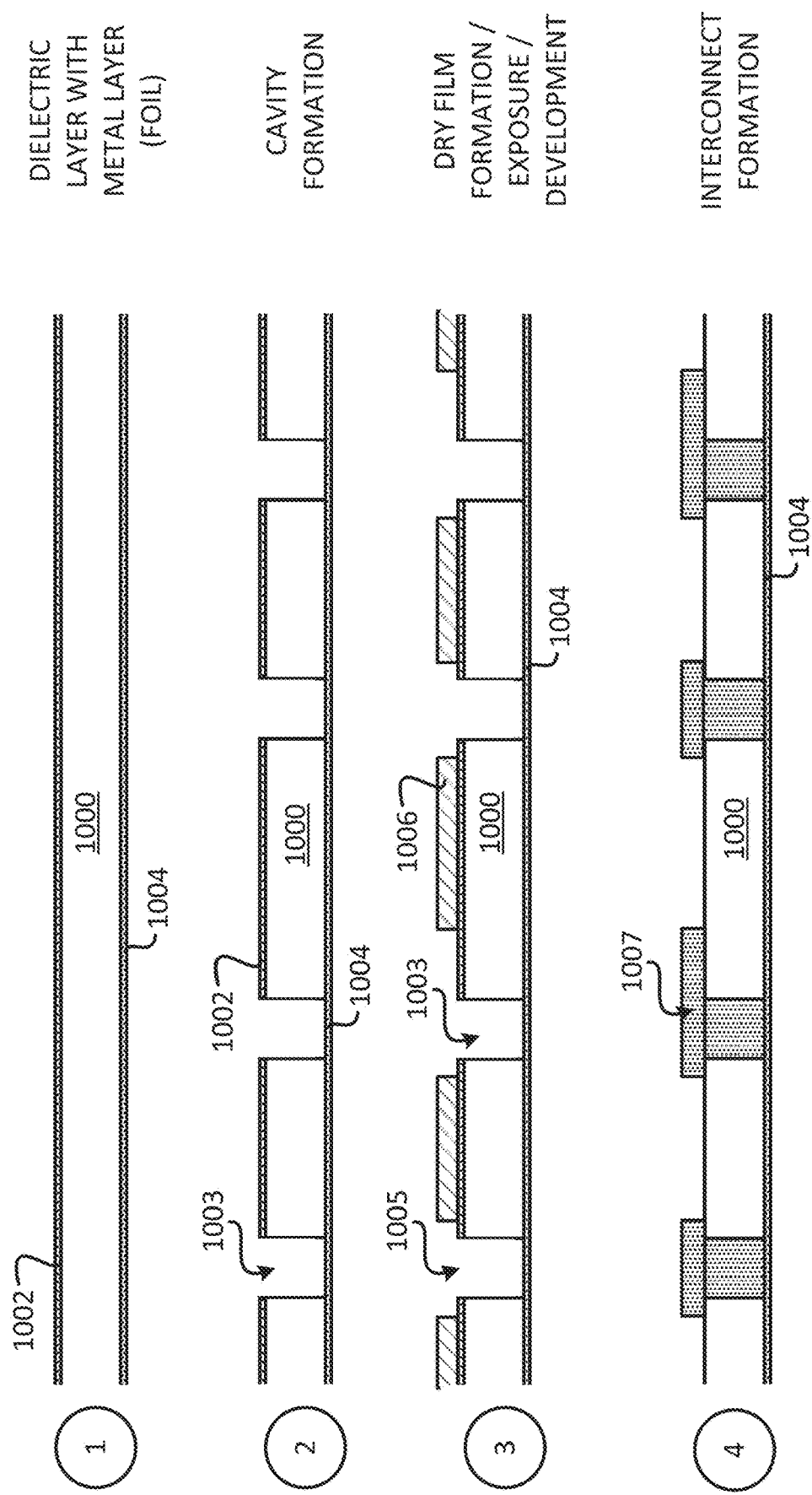

Stage 1, as shown in FIG. 10A, illustrates a state after a dielectric layer 1000 is provided. The dielectric layer 1000 may include metal layers (e.g., 1002, 1004). The dielectric layer 1000 may include a prepreg. The metal layers (e.g., 1002, 1004) may include a copper foil.

Stage 2 illustrates a state after a plurality of cavities 1003 is formed through the metal layer 1002 and the dielectric layer 1000. A laser process (e.g., laser ablation) may be used to form the cavities 1003.

Stage 3 illustrates a state after a dry film 1006 is formed over the metal layer 1002 and the dielectric layer 1000. A deposition process may be used to form the dry film 1006. Stage 3 also illustrates a state after a plurality of cavities 1005 is formed through the dry film 1006. Forming the cavities may include dry film exposure and development.

Stage 4 illustrates a state after a plurality of interconnects 1007 is formed in and over the dielectric layer 1000. A plating process or a pasting process may be used to form the interconnects 1007. Stage 4 illustrates a state after the dry film 1006 is removed.

Figure 10B:
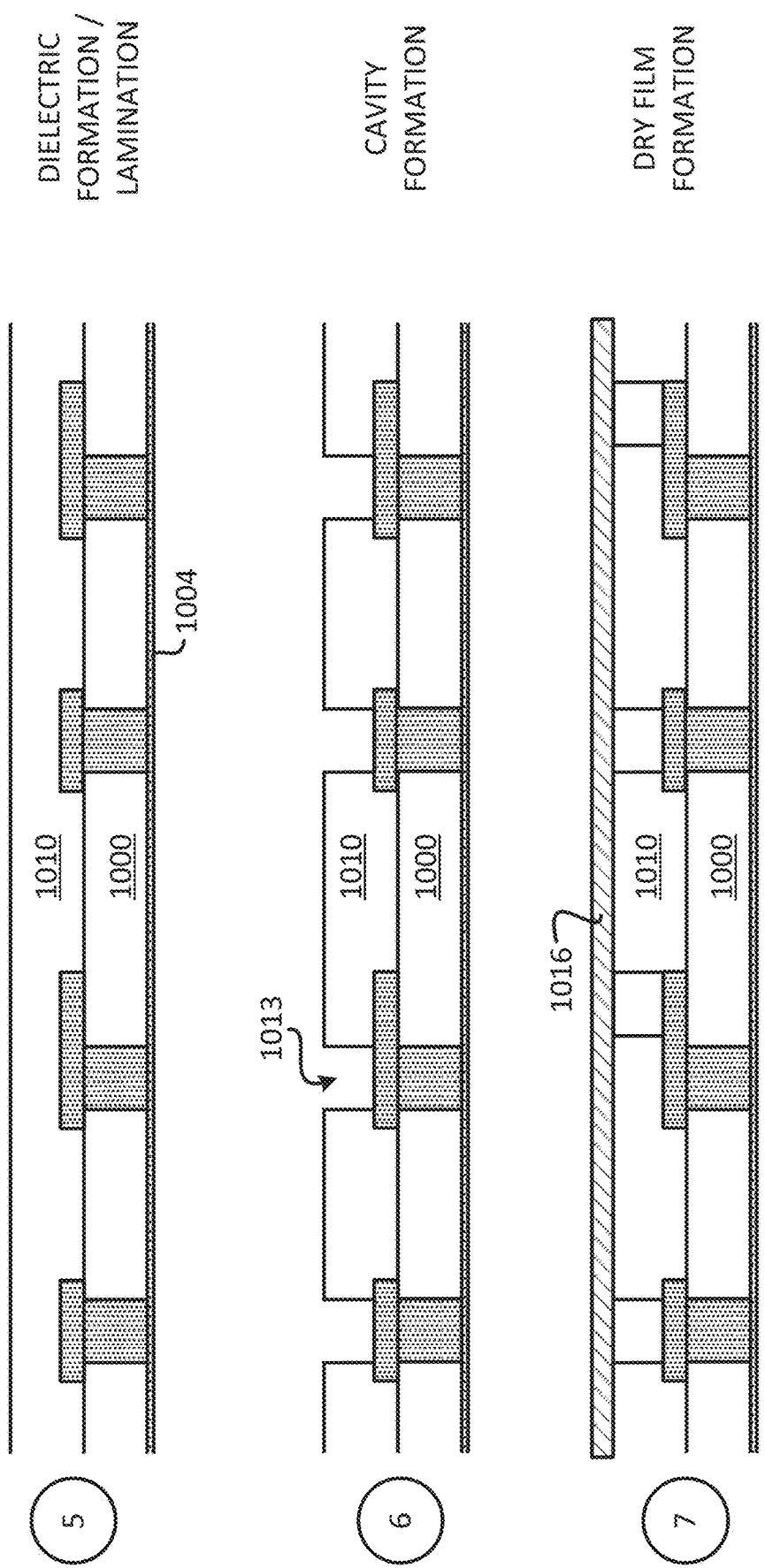

Stage 5, as shown in FIG. 10B, illustrates a state after a dielectric layer 1010 is formed over the dielectric layer 1000 and the plurality of interconnects 1007. A deposition process may be used to form the dielectric layer 1010.

Stage 6 illustrates a state after a plurality of cavities 1013 is formed through the dielectric layer 1010. A laser process (e.g., laser ablation), a lithography process (e.g., exposure and development), or an etching process may be used to form the cavities 1013.

Stage 7 illustrates a state after a dry film 1016 is formed over the dielectric layer 1010. A deposition process may be used to form the dry film 1016.

Figure 10C:
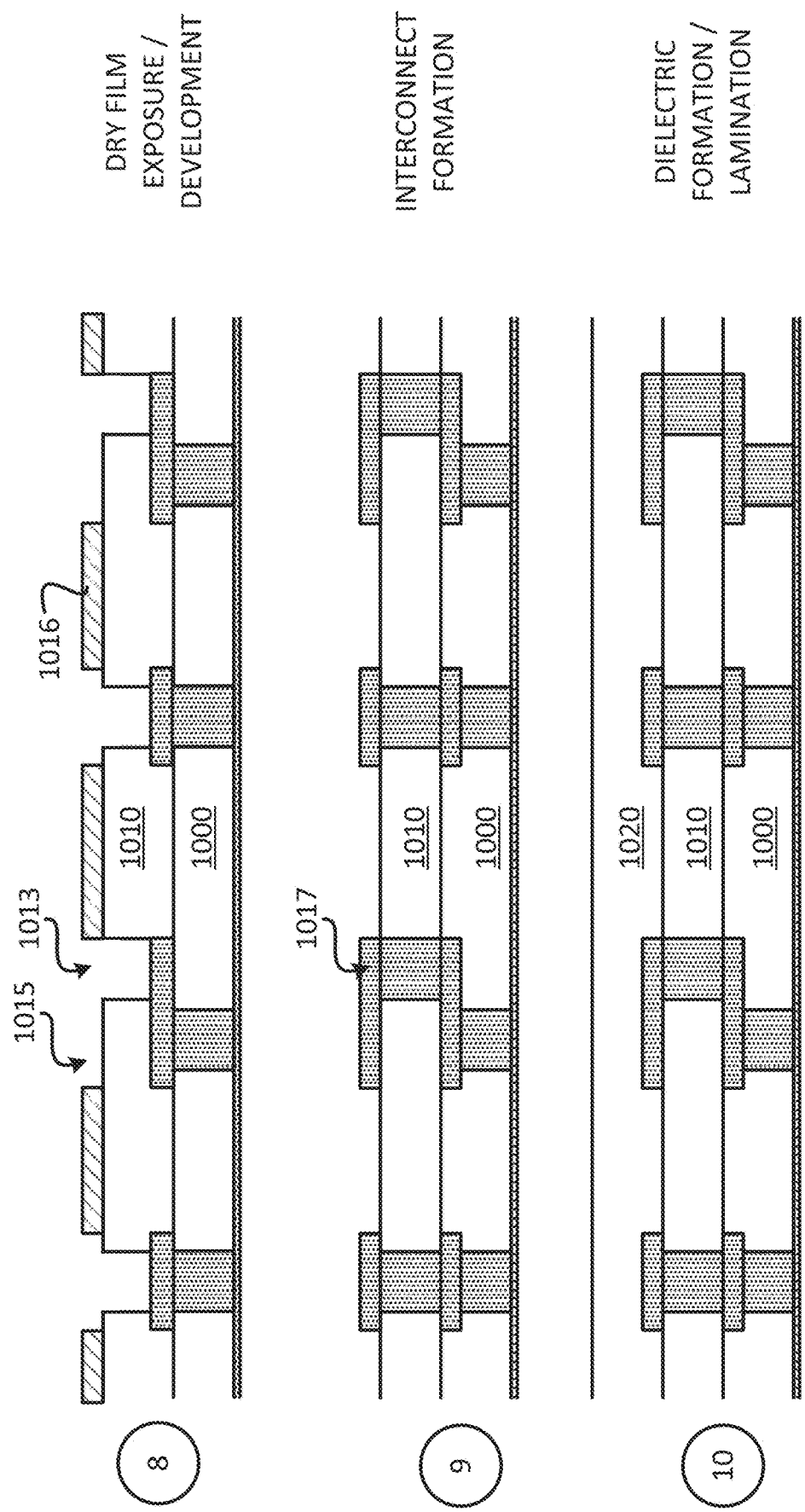

Stage 8, as shown in FIG. 10C, illustrates a state after a plurality of cavities 1015 is formed through the dry film 1016. Forming the cavities 1015 may include dry film exposure and development.

Stage 9 illustrates a state after a plurality of interconnects 1017 is formed in and over the dielectric layer 1010. A plating process or a pasting process may be used to form the interconnects 1017. Stage 9 illustrates a state after the dry film 1016 is removed.

Stage 10 illustrates a state after a dielectric layer 1020 is formed over the dielectric layer 1010 and the plurality of interconnects 1017. A deposition process may be used to form the dielectric layer 1020.

Figure 10D:
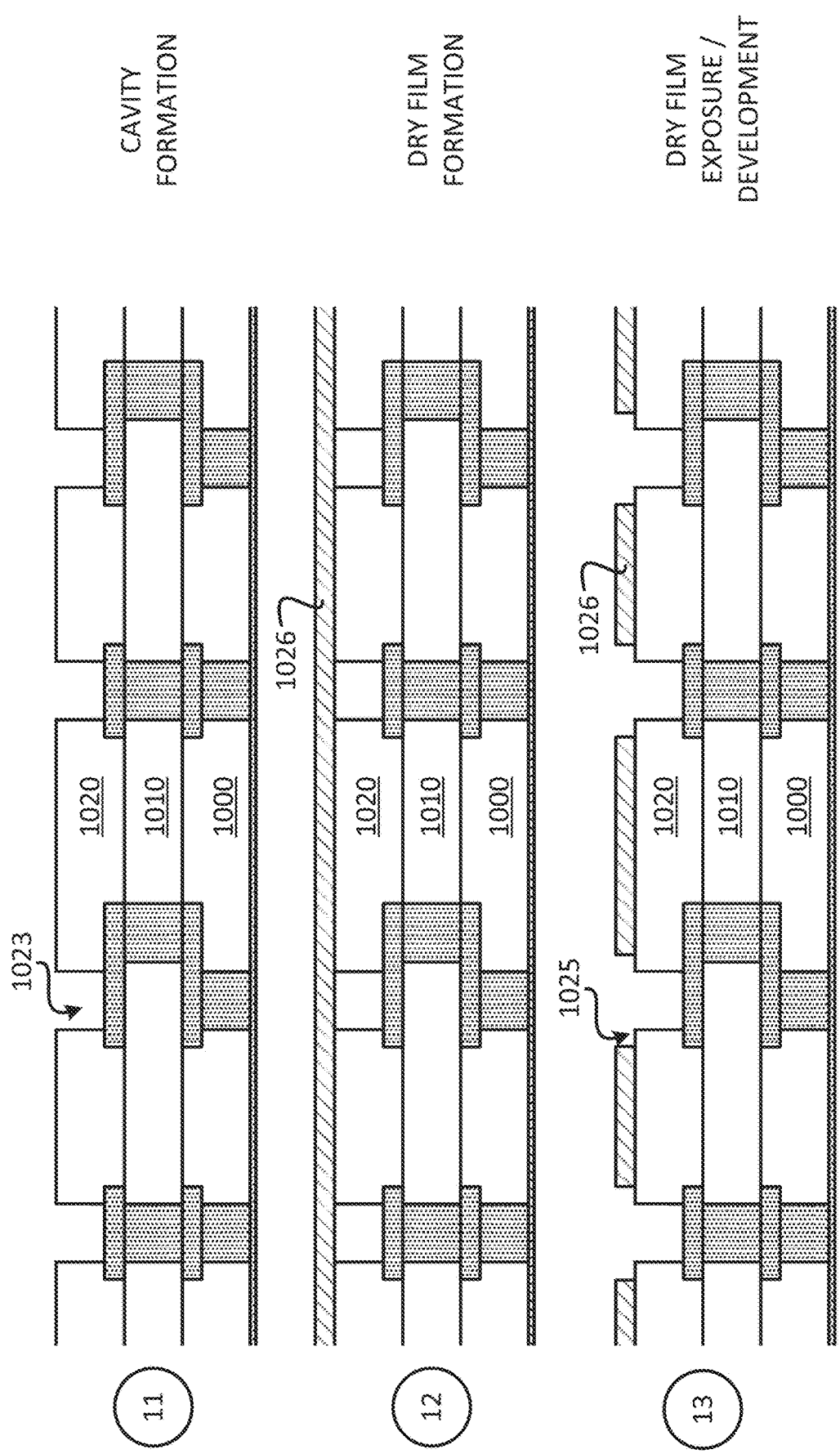

Stage 11, as shown in FIG. 10D, illustrates a state after a plurality of cavities 1023 is formed through the dielectric layer 1020. A laser process (e.g., laser ablation), a lithography process (e.g., exposure and development), or an etching process may be used to form the cavities 1023.

Stage 12 illustrates a state after a dry film 1026 is formed over the dielectric layer 1020. A deposition process may be used to form the dry film 1026.

Stage 13 illustrates a state after a plurality of cavities 1025 is formed through the dry film 1026. Forming the cavities may include dry film exposure and development.

Figure 10E:
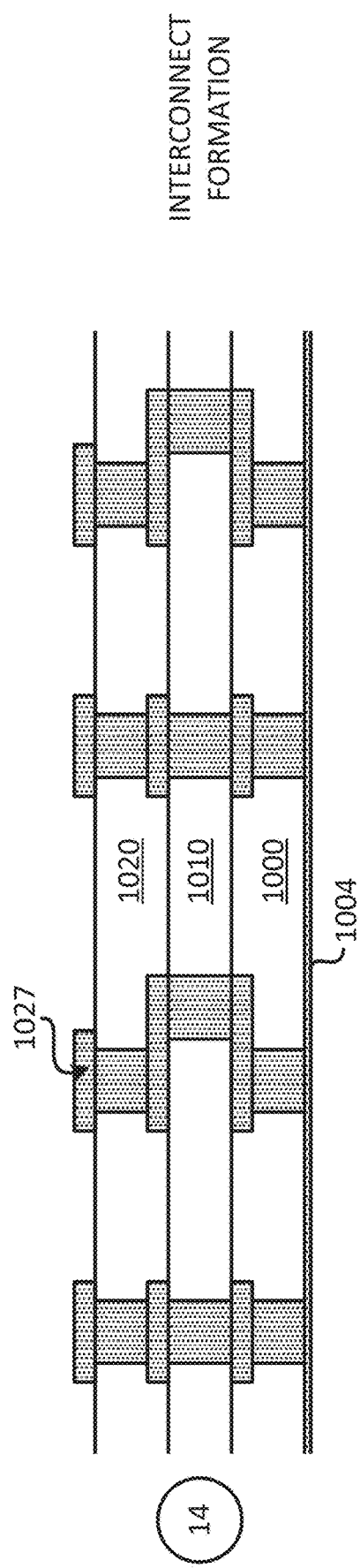
Figure 10E:
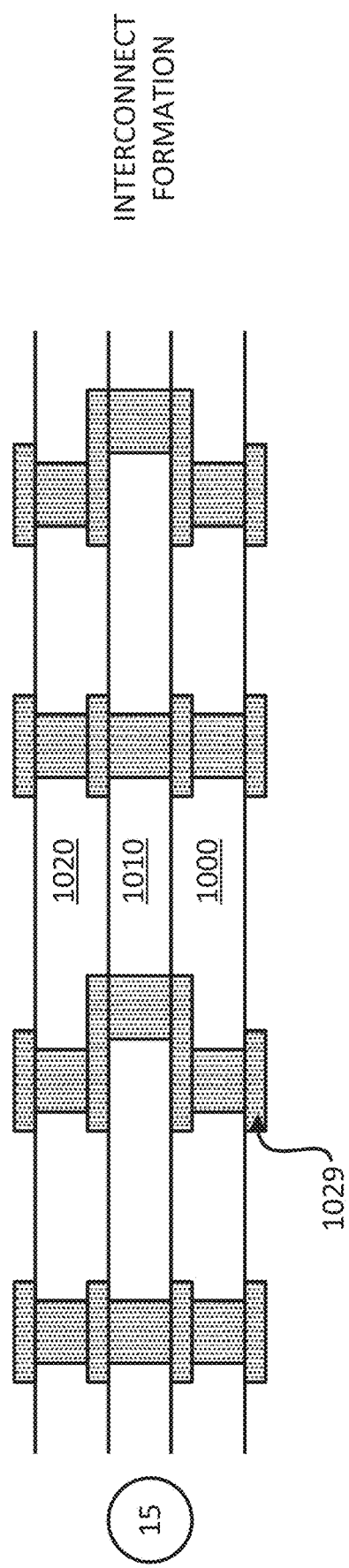

Stage 14, as shown in FIG. 10E, illustrates a state after a plurality of interconnects 1027 is formed in and over the dielectric layer 1020. A plating process or a pasting process may be used to form the interconnects 1027. Stage 14 illustrates a state after the dry film 1026 is removed.

Stage 15 illustrates a state after the plurality of interconnects 1029 is formed over the dielectric layer 1000. A plating process or a pasting process may be used to form the interconnects 1029. The interconnects 1029 may include the metal layer 1004. In some implementations, the metal layer 1004 may be removed before forming the interconnects 1029.

Stage 16, as shown in FIG. 10F, illustrates a state after a dielectric layer 1030 is formed over the dielectric layer 1020, and a dielectric layer 1040 is formed over the dielectric layer 1000. A deposition process may be used to form the dielectric layers 1030 and 1040.

Stage 17 illustrates a state after singulation that forms several match structures, such as a match structure 205a and a match structure 205b. The match structure 205a includes the at least one dielectric layer 250, the first plurality of match interconnects 251 and the second plurality of match interconnects 253. The at least one dielectric layer 250 may represent the dielectric layers 1000, 1010, 1020, 1030, and/or 1040. The dielectric layers 1000, 1010, 1020, 1030, and/or 1040 may include prepreg. Vias in the dielectric layers 1000, 1010 and/or 1020 may have a thickness in a range of 25 micrometers to 80 micrometers. The first plurality of match interconnects 251 may include first interconnects from the plurality of interconnects 1007, 1017, 1027 and/or 1029. The second plurality of match interconnects 253 may include second interconnects from the plurality of interconnects 1007, 1017, 1027 and/or 1029.

Exemplary Electronic Devices

Figure 11:
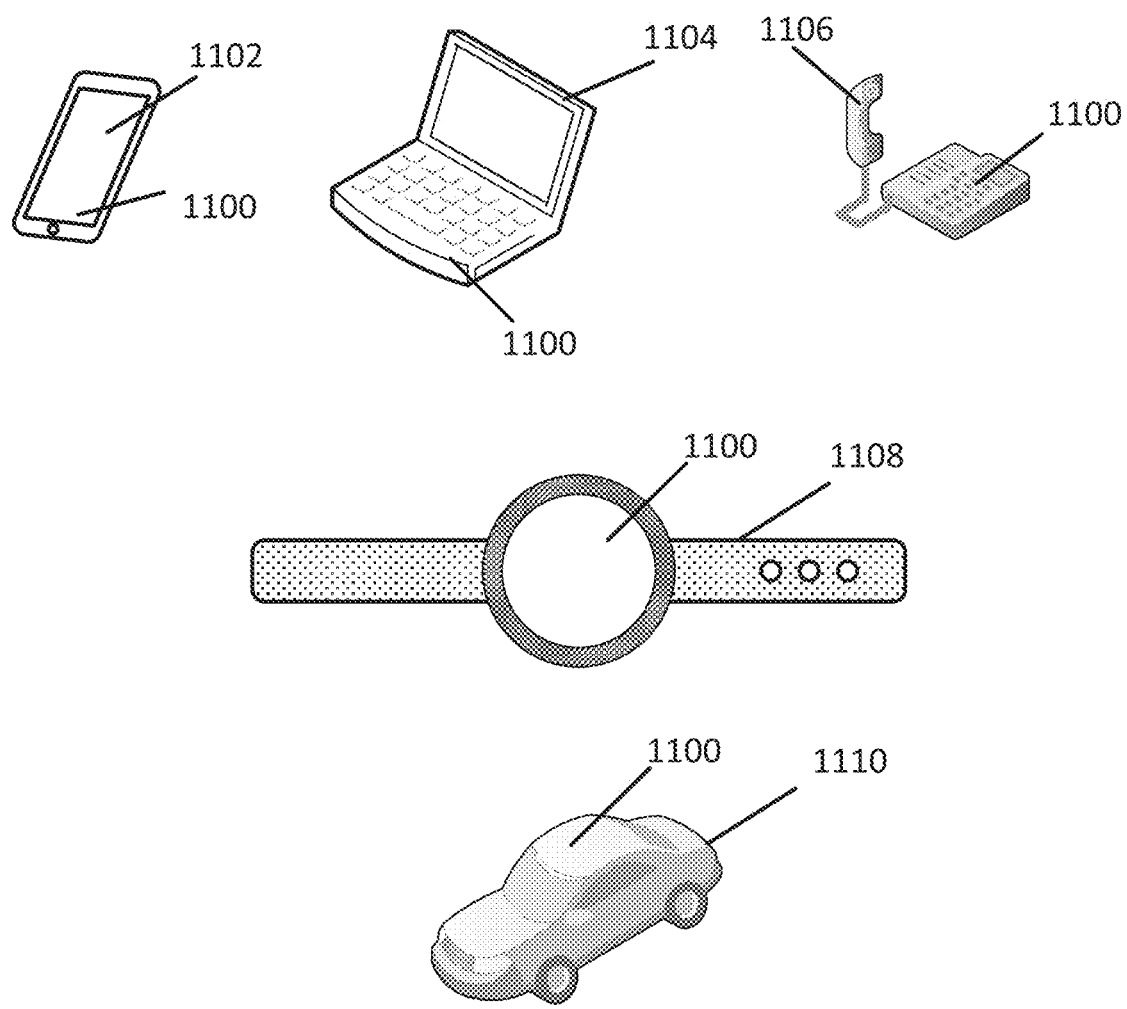
FIG. 11 illustrates various electronic devices that may integrate a die, an integrated device, an integrated passive device (IPD), a device package, a package, an integrated circuit and/or PCB described herein.

FIG. 11 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 1102, a laptop computer device 1104, a fixed location terminal device 1106, a wearable device 1108, or automotive vehicle 1110 may include a device 1100 as described herein. The device 1100 may be, for example, any of the devices and/or integrated circuit (IC) packages described herein. The devices 1102, 1104, 1106 and 1108 and the vehicle 1110 illustrated in FIG. 11 are merely exemplary. Other electronic devices may also feature the device 1100 including, but not limited to, a group of devices (e.g., electronic devices) that includes mobile devices, handheld personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 2-6, 7A-7D, 8, 9A-9D, 10A-10F, and/or 11 may be rearranged and/or combined into a single component, process, feature or function or embodied in several components, processes, or functions. Additional elements, components, processes, and/or functions may also be added without departing from the disclosure. It should also be noted FIGS. 2-6, 7A-7D, 8, 9A-9D, 10A-10F, and/or 11 and its corresponding description in the present disclosure is not limited to dies and/or ICs. In some implementations, FIGS. 2-6, 7A-7D, 8, 9A-9D, 10A-10F, and/or 11 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another—even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The term "encapsulating" means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a metallization layer, a redistribution layer, and/or an under bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. An interconnect may include one or more metal layers. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the following, further examples are described to facilitate the understanding of the invention.

Aspect 1: A substrate comprising a core layer; a match structure located in the core layer, at least one first dielectric layer coupled to a first surface of the core layer; and at least one second dielectric layer coupled to a second surface of the core layer. The match structure includes at least one first match interconnect extending vertically and horizontally in the match structure; and at least one second match interconnect extending vertically in the match structure, wherein the at least one first match interconnect and the at least one second match interconnect are configured for skew matching.

Aspect 2: The substrate of aspect 1, wherein the match structure further comprises at least one structure dielectric layer.

Aspect 3: The substrate of aspect 1, wherein the match structure further comprises a structure core layer; and at least one structure dielectric layer.

Aspect 4: The substrate of aspects 1 through 3, wherein the at least one first match interconnect is configured to provide an electrical path for a positive signal; and wherein the at least one second core interconnect is configured to provide an electrical path for a negative signal.

Aspect 5: The substrate of aspect 4, wherein the positive signal and the negative signal are configured as a pair of differential signals.

Aspect 6: The substrate of aspects 1 through 5, wherein the at least one first match interconnect and the at least one second match interconnect are configured as a differential pair of match interconnects.

Aspect 7: The substrate of aspects 1 through 6, wherein the at least one second core interconnect includes at least one turn of interconnects.

Aspect 8: The substrate of aspects 1 through 7, wherein a first electrical path distance between two first terminals that include the at least one first match interconnect is approximately the same as a second electrical path distance between two second terminals that includes the at least one second match interconnect.

Aspect 9: The substrate of aspects 1 through 8, wherein the at least one first match interconnect extends vertically and horizontally in a structure dielectric layer of the match structure; and wherein the at least one second match interconnect extends vertically in the structure dielectric layer of the match structure.

Aspect 10: The substrate of aspects 1 through 9, wherein the substrate is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

Aspect 11: A package comprising an integrated device and a substrate coupled to the integrated device. The substrate includes a core layer, a match structure located in the core layer, at least one first dielectric layer coupled to a first surface of the core layer, and at least one second dielectric layer coupled to a second surface of the core layer. The match structure includes at least one first match interconnect extending vertically and horizontally in the match structure, and at least one second match interconnect extending vertically in the match structure, wherein the at least one first match interconnect and the at least one second match interconnect are configured for skew matching.

Aspect 12: The package of aspect 11, wherein the match structure further comprises at least one structure dielectric layer.

Aspect 13: The package of aspect 11, wherein the match structure further comprises a structure core layer; and at least one structure dielectric layer.

Aspect 14: The package of aspects 11 through 13, wherein the at least one first match interconnect is configured to provide an electrical path for a positive signal; and wherein the at least one second match interconnect is configured to provide an electrical path for a negative signal.

Aspect 15: The package of aspect 14, wherein the positive signal and the negative signal are configured as a pair of differential signals.

Aspect 16: The package of aspects 11 through 15, wherein the at least one first match interconnect and the at least one second match interconnect are configured as a differential pair of core interconnects.

Aspect 17: The package of aspects 11 through 16, wherein a first electrical path distance between two first terminals that include the at least one first match interconnect is approximately the same as a second electrical path distance between two second terminals that includes the at least one second match interconnect.

Aspect 18: An apparatus comprising a core layer; means for skew matching located in the core layer, at least one first dielectric layer coupled to a first surface of the core layer, and at least one second dielectric layer coupled to a second surface of the core layer. The means for skew matching includes at least one first match interconnect extending vertically and horizontally in the means for skew matching; and at least one second match interconnect extending vertically in the means for skew matching, wherein the at least one first match interconnect and the at least one second match interconnect are configured to provide time signal matching for a first signal and a second signal.

Aspect 19: The apparatus of aspect 18, wherein the at least one first match interconnect is configured to provide an electrical path for a positive signal; and wherein the at least one second core interconnect is configured to provide an electrical path for a negative signal.

Aspect 20: The apparatus of aspects 18 through 19, wherein a first electrical path distance between two first terminals that include the at least one first match interconnect is approximately the same as a second electrical path distance between two second terminals that includes the at least one second match interconnect.

Aspect 21: A method for fabricating a substrate. The method provides a core layer with at least one cavity. The method places a match structure in the at least one cavity of the core layer. The match structure comprises at least one first match interconnect extending vertically and horizontally in the match structure, and at least one second match interconnect extending vertically in the match structure, wherein the at least one first match interconnect and the at least one second match interconnect are configured for skew matching. The method forms at least one first dielectric layer over to a first surface of the core layer. The method forms at least one second dielectric layer over to a second surface of the core layer.

Aspect 22: The method of aspect 21, wherein the match structure further comprises a structure core layer; and at least one structure dielectric layer.

Aspect 23: The method of aspects 21 through 22, wherein the at least one first match interconnect is configured to provide an electrical path for a positive signal; and wherein the at least one second match interconnect is configured to provide an electrical path for a negative signal.

Aspect 24: The method of aspects 21 through 23, wherein a first electrical path distance between two first terminals that include the at least one first match interconnect is approximately the same as a second electrical path distance between two second terminals that includes the at least one second match interconnect.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A substrate comprising:
a core layer;
a match structure located at least partially in the core layer, the match structure comprising:
a plurality of first match interconnects comprising:
a first match via extending vertically in the match structure; and
a first match trace extending horizontally in the match structure,
wherein the first match via and the first match trace are located laterally to the core layer;
at least one second match interconnect extending vertically in the match structure, wherein the plurality of first match interconnects and the at least one second match interconnect are configured for skew matching; and
at least one structure dielectric layer that is located at least laterally to the core layer;
at least one first dielectric layer coupled to a first surface of the core layer; and
at least one second dielectric layer coupled to a second surface of the core layer.

2. The substrate of claim 1,
wherein the at least one structure dielectric layer is located at least partially in the core layer, and
wherein the core layer is a single core layer located between the at least one first dielectric layer and the at least one second dielectric layer.

3. The substrate of claim 1, wherein the match structure further comprises a structure core layer, wherein at least a portion of the plurality of first match interconnects extending vertically and at least a portion of the second match interconnect extending vertically are located inside a cavity of the structure core layer.

4. The substrate of claim 1,
wherein the plurality of first match interconnects are configured to provide an electrical path for a positive signal; and
wherein the at least one second match interconnect is configured to provide an electrical path for a negative signal.

5. The substrate of claim 4, wherein the positive signal and the negative signal are configured as a pair of differential signals.

6. The substrate of claim 1, wherein the plurality of first match interconnects and the at least one second match interconnect are configured as a differential pair of match interconnects.

7. The substrate of claim 1, wherein the at least one second match interconnect includes at least one turn of interconnects.

8. The substrate of claim 1, wherein a first electrical path distance between two first terminals that include the plurality of first match interconnects is approximately the same as a second electrical path distance between two second terminals that includes the at least one second match interconnect.

9. The substrate of claim 1,
wherein the plurality of first match interconnects extend vertically and horizontally in the at least one structure dielectric layer of the match structure; and
wherein the at least one second match interconnect extends vertically in the at least one structure dielectric layer of the match structure.

10. The substrate of claim 1, wherein the substrate is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

11. A package comprising:
an integrated device; and a substrate coupled to the integrated device, the substrate comprising:
a core layer;
a match structure located at least partially in the core layer, the match structure comprising:
a plurality of first match interconnects comprising:
a first match via extending vertically in the match structure; and
a first match trace extending horizontally in the match structure,
wherein the first match via and the first match trace are located laterally to the core layer;
at least one second match interconnect extending vertically in the match structure, wherein the at least one first match interconnect and the at least one second match interconnect are configured for skew matching; and
at least one structure dielectric layer that is located at least laterally to the core layer;
at least one first dielectric layer coupled to a first surface of the core layer; and
at least one second dielectric layer coupled to a second surface of the core layer.

12. The package of claim 11,
wherein the at least one structure dielectric layer is located at least partially in the core layer, and
wherein the core layer is a single core layer located between the at least one first dielectric layer and the at least one second dielectric layer.

13. The package of claim 11, wherein the match structure further comprises a structure core layer, wherein at least a portion of the plurality of first match interconnects extending vertically and at least a portion of the second match interconnect extending vertically are located inside a cavity of the structure core layer.

14. The package of claim 11,
wherein the plurality of first match interconnects are configured to provide an electrical path for a positive signal; and
wherein the at least one second match interconnect is configured to provide an electrical path for a negative signal.

15. The package of claim 14, wherein the positive signal and the negative signal are configured as a pair of differential signals.

16. The package of claim 11, wherein the plurality of first match interconnects and the at least one second match interconnect are configured as a differential pair of interconnects.

17. The package of claim 11, wherein a first electrical path distance between two first terminals that include the plurality of first match interconnects is approximately the same as a second electrical path distance between two second terminals that includes the at least one second match interconnect.

18. An apparatus comprising:
a core layer;
means for skew matching located at least partially in the core layer, the means for skew matching comprising:
a first means for skew matching extending vertically and horizontally in the core layer; and
a second means for skew matching extending vertically in the means for skew matching, wherein the first means for skew matching and second means for skew matching are configured to provide time signal matching for a first signal and a second signal; and
at least one structure dielectric layer that is located at least laterally to the core layer;
at least one first dielectric layer coupled to a first surface of the core layer; and
at least one second dielectric layer coupled to a second surface of the core layer.

19. The apparatus of claim 18,
wherein the first means for skew matching is configured to provide an electrical path for a positive signal; and
wherein the second means for skew matching is configured to provide an electrical path for a negative signal.

20. The apparatus of claim 18, wherein a first electrical path distance between two first terminals that include the first means for skew matching is approximately the same as a second electrical path distance between two second terminals that includes the second means for skew matching.

21. A method for fabricating a substrate, comprising:
providing a core layer with at least one cavity;
placing a match structure in the at least one cavity of the core layer, the match structure comprising:
at least one first match interconnect extending vertically and horizontally in the match structure;
at least one second match interconnect extending vertically in the match structure, wherein the at least one first match interconnect and the at least one second match interconnect are configured for skew matching; and
at least one structure dielectric layer that is located at least laterally to the core layer;
forming at least one first dielectric layer over to a first surface of the core layer; and
forming at least one second dielectric layer over to a second surface of the core layer.

22. The method of claim 21, wherein the match structure further comprises:
a structure core layer, wherein at least a portion of the first match interconnect extending vertically and at least a portion of the second match interconnect extending vertically are located inside a cavity of the structure core layer.

23. The method of claim 21,
wherein the at least one first match interconnect is configured to provide an electrical path for a positive signal; and
wherein the at least one second match interconnect is configured to provide an electrical path for a negative signal.

24. The method of claim 21, wherein a first electrical path distance between two first terminals that include the at least one first match interconnect is approximately the same as a second electrical path distance between two second terminals that includes the at least one second match interconnect.

* * * * *